United States Patent
Yang et al.

(10) Patent No.: US 10,839,928 B1
(45) Date of Patent: Nov. 17, 2020

(54) NON-VOLATILE MEMORY WITH COUNTERMEASURE FOR OVER PROGRAMMING

(71) Applicant: SANDISK TECHNOLOGIES LLC, Addison, TX (US)

(72) Inventors: Xiang Yang, Santa Clara, CA (US); Gerrit Jan Hemink, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/413,882

(22) Filed: May 16, 2019

(51) Int. Cl.
  *G11C 16/34* (2006.01)
  *G11C 11/56* (2006.01)
  *G11C 16/10* (2006.01)
  *G11C 16/26* (2006.01)
  *G11C 16/24* (2006.01)
  *G11C 16/08* (2006.01)

(52) U.S. Cl.
  CPC ...... *G11C 16/3486* (2013.01); *G11C 11/5628* (2013.01); *G11C 11/5642* (2013.01); *G11C 16/08* (2013.01); *G11C 16/10* (2013.01); *G11C 16/24* (2013.01); *G11C 16/26* (2013.01); *G11C 16/3454* (2013.01); *G11C 16/3463* (2013.01); *G11C 16/3481* (2013.01)

(58) Field of Classification Search
  CPC ........ G11C 16/3454; G11C 16/163463; G11C 16/3463
  USPC .......................... 365/185.22, 185.27, 185.28
  See application file for complete search history.

(56) References Cited

U.S. PATENT DOCUMENTS

| | | | |
|---|---|---|---|
| 5,321,699 | A | 6/1994 | Endoh |
| 5,386,422 | A | 1/1995 | Endoh |
| 5,469,444 | A | 11/1995 | Endoh |
| 5,602,789 | A | 2/1997 | Endoh |
| 5,771,346 | A | 6/1998 | Norman |
| 5,991,201 | A | 11/1999 | Kuo |
| 6,134,140 | A | 10/2000 | Tanaka |
| 6,914,823 | B2 | 7/2005 | Chen |
| 6,917,542 | B2 | 7/2005 | Chen |
| 7,073,103 | B2 | 7/2006 | Gongwer |
| 7,092,290 | B2 | 8/2006 | Hemink |
| 7,215,575 | B2 | 5/2007 | Chen |
| 7,301,817 | B2 | 11/2007 | Li |

(Continued)

OTHER PUBLICATIONS

Response to Office Action dated Jun. 18, 2020, U.S. Appl. No. 16/413,891.

(Continued)

*Primary Examiner* — Son L Mai
(74) *Attorney, Agent, or Firm* — Vierra Magen Marcus LLP

(57) ABSTRACT

A non-volatile storage system includes a mechanism to compensate for over programming during the programming process. That is, after the programming process starts for a set of data and target memory cells, and prior to the programming process completing for the set of data and the target memory cells, the system determines whether a first group of the memory cells has more than a threshold number of over programmed memory cells. If so, then the system adjusts programming of a second group of memory cells to reduce the number of programming errors.

19 Claims, 20 Drawing Sheets

(56) References Cited

U.S. PATENT DOCUMENTS

| | | | |
|---|---|---|---|
| 7,570,520 B2 | 8/2009 | Kamei | |
| 8,077,524 B2 | 12/2011 | Lutze | |
| 8,174,895 B2 * | 5/2012 | Chen | G11C 11/5628 365/185.03 |
| 8,218,366 B2 * | 7/2012 | Dong | G11C 11/5628 365/185.02 |
| 8,422,305 B2 * | 4/2013 | Lee | G11C 16/3404 365/185.09 |
| 8,456,915 B2 | 6/2013 | Chen | |
| 9,142,302 B2 | 9/2015 | Dong | |
| 9,564,226 B1 | 2/2017 | Dunga | |
| 9,607,698 B2 * | 3/2017 | Lee | G11C 16/10 |
| 9,811,267 B1 | 11/2017 | Yang | |
| 9,852,800 B2 | 12/2017 | Lang | |
| 10,014,063 B2 | 7/2018 | Tseng | |
| 10,580,504 B2 * | 3/2020 | Zhao | G11C 16/3459 |
| 2005/0024939 A1 | 2/2005 | Chen | |
| 2010/0329021 A1 | 12/2010 | Lee | |
| 2011/0157996 A1 | 6/2011 | Honda | |
| 2011/0170349 A1 | 7/2011 | Avraham | |
| 2011/0255345 A1 | 10/2011 | Dong | |
| 2014/0334228 A1 | 11/2014 | Kim | |
| 2016/0240256 A1 | 8/2016 | Lin et al. | |
| 2017/0025176 A1 | 1/2017 | Lee | |
| 2017/0256320 A1 | 9/2017 | Lang | |
| 2019/0164618 A1 | 5/2019 | Yun et al. | |
| 2020/0051649 A1 * | 2/2020 | Her | G11C 16/30 |

OTHER PUBLICATIONS

PCT International Search Report dated Apr. 6, 2020, PCT Patent Application No. PCT/US2019/066416.

PCT Written Opinion of the International Searching Authority dated Apr. 6, 2020, PCT Patent Application No. PCT/US2019/066416.

Office Action dated May 28, 2020, U.S. Appl. No. 16/413,891.

PCT International Search Report dated Mar. 31, 2020, PCT Patent Application No. PCT/US2019/066415.

PCT Written Opinion of the International Searching Authority dated Mar. 31, 2020, PCT Patent Application No. PCT/US2019/066415.

Notice of Allowance dated Aug. 11, 2020, U.S. Appl. No. 16/413,891.

* cited by examiner

Figure 4D
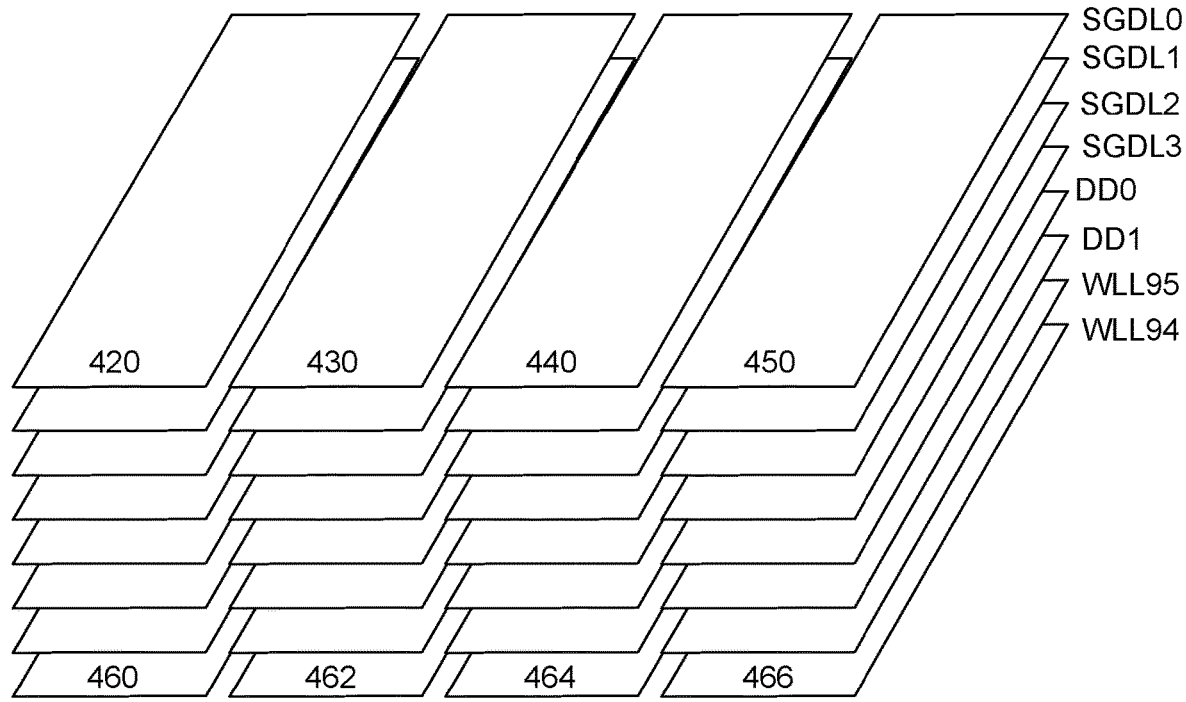
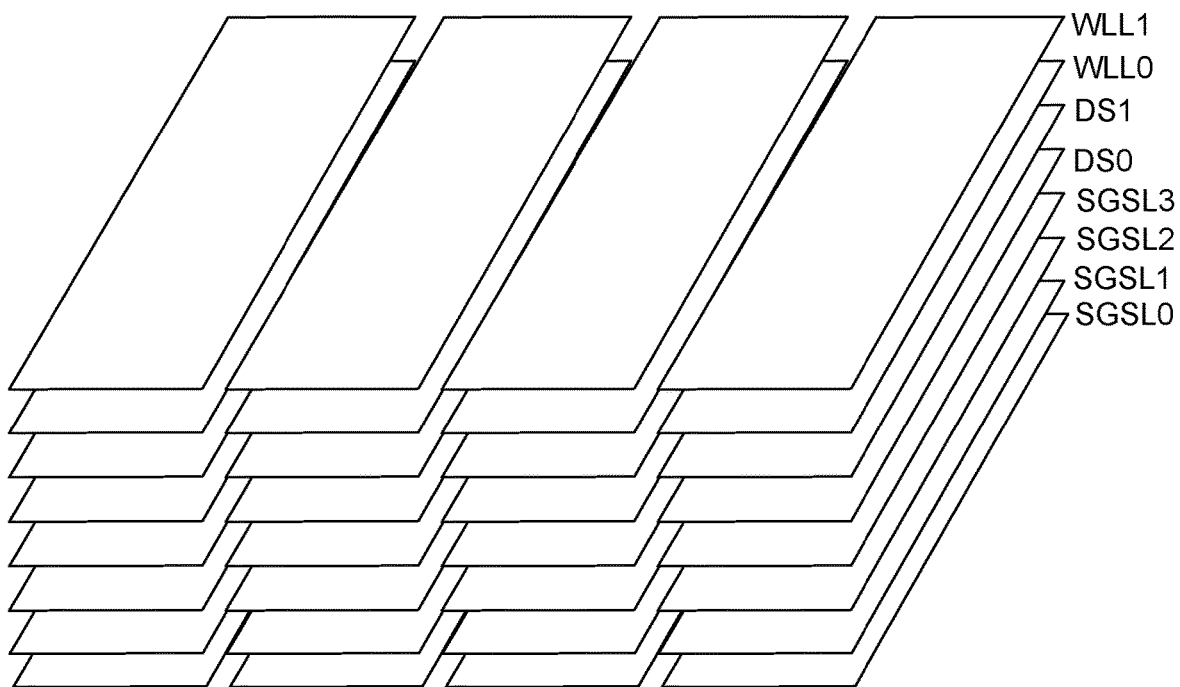

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

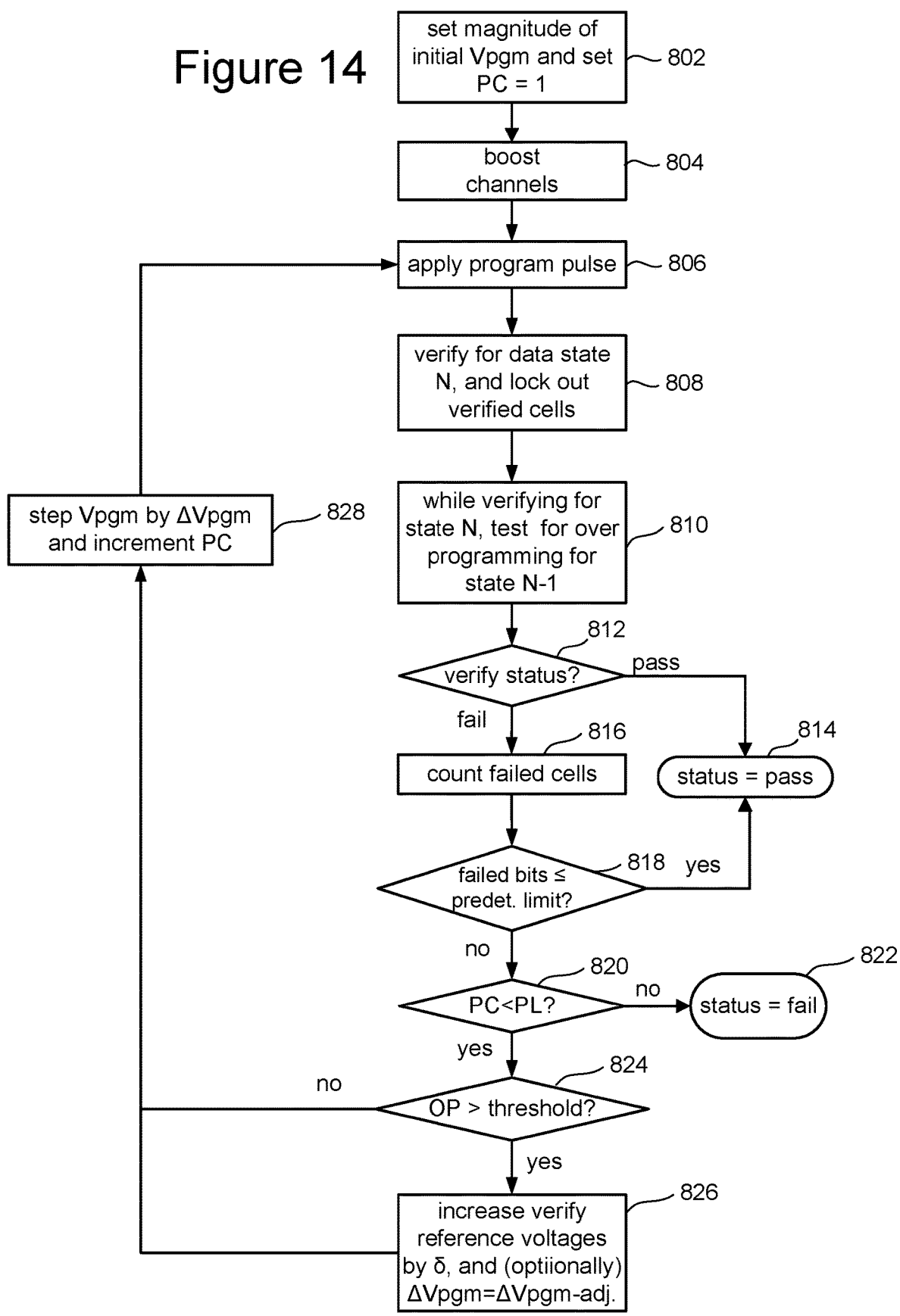

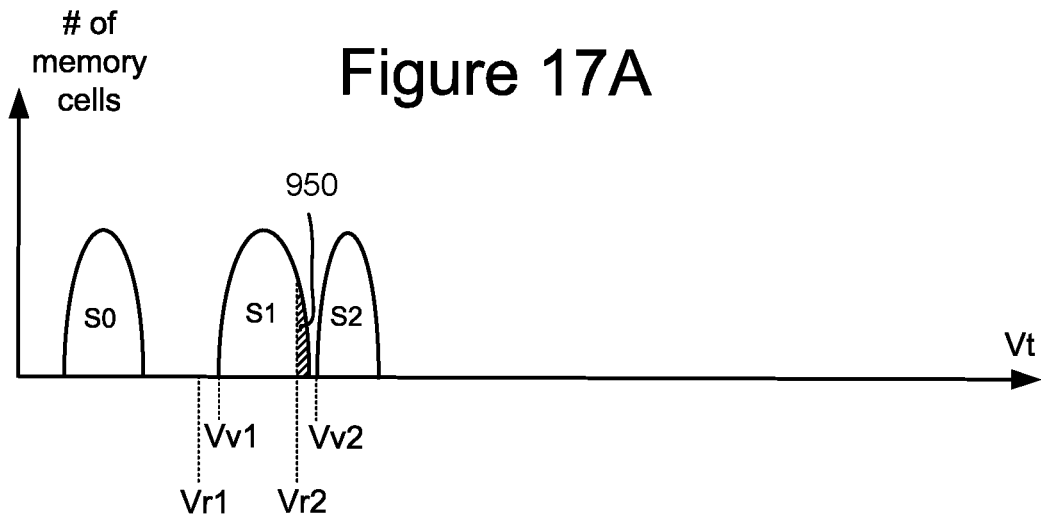
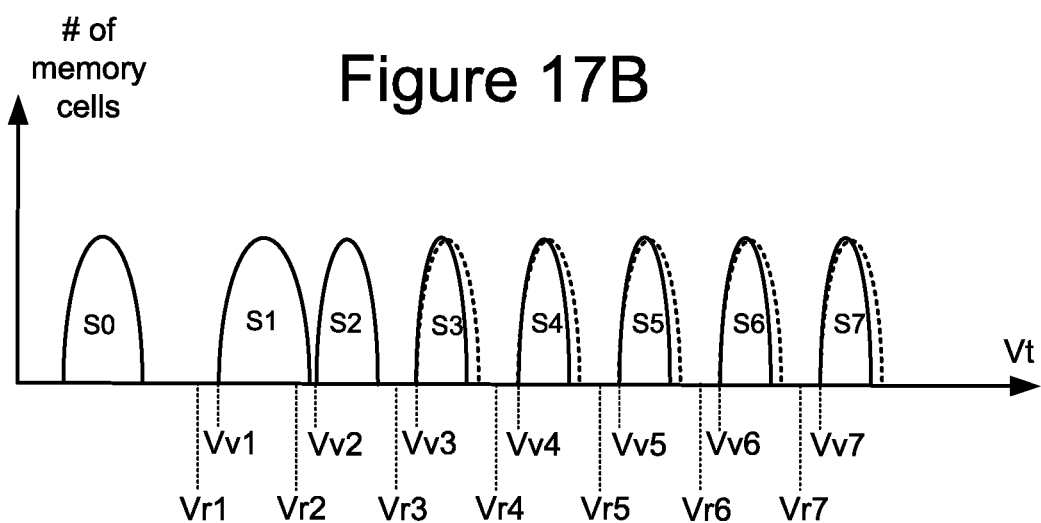

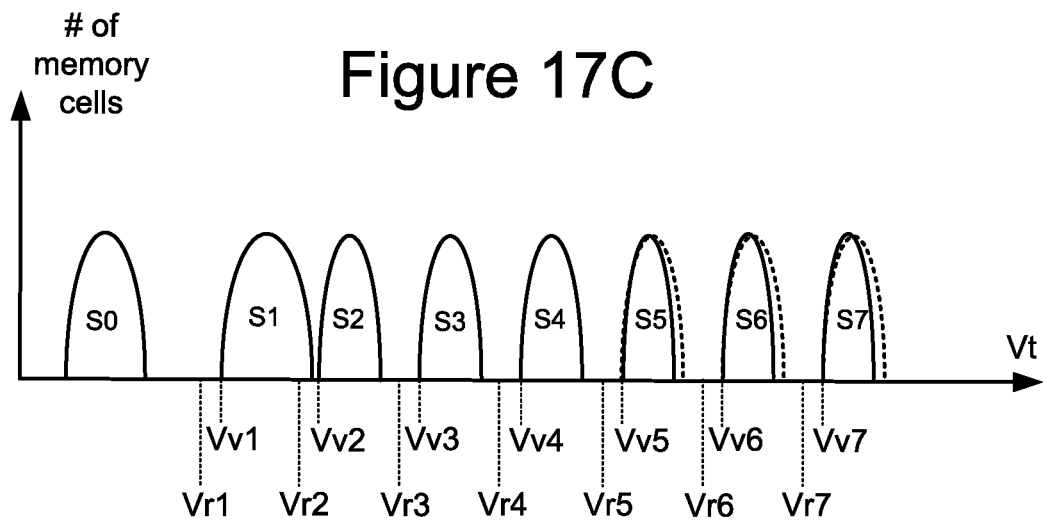
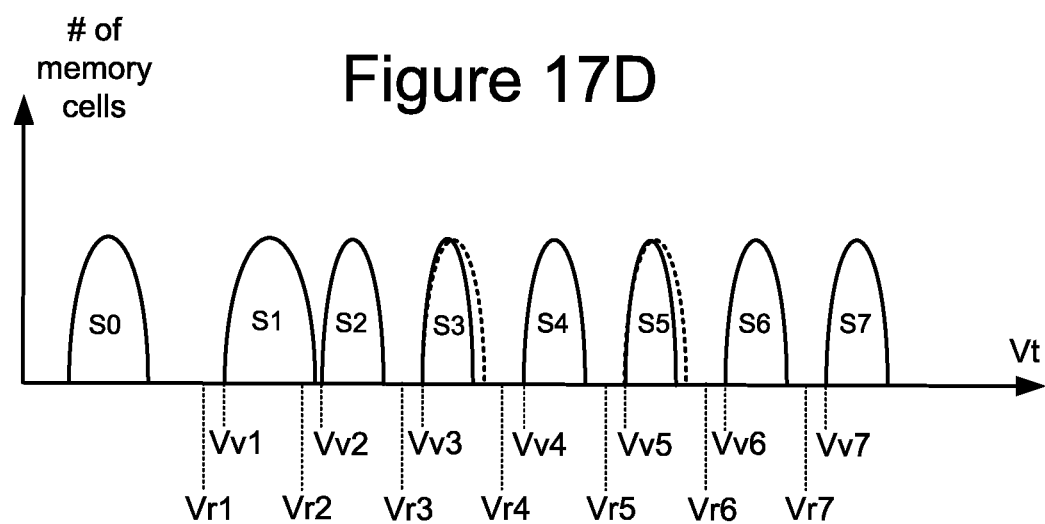

NON-VOLATILE MEMORY WITH COUNTERMEASURE FOR OVER PROGRAMMING

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems often include a plurality of memory cells connected to a control circuit, such that the control circuit is used to manage, program (write), and read the memory cells. In many cases it is necessary to program multiple memory cells in parallel, for example, in order to produce a commercially desirable memory system which can be programmed within a reasonable amount of time. However, a problem arises when a number of the memory cells are to be programmed at the same time. This is because the characteristics of each memory cell is different due to minor variations in the structure and operation of the semiconductor devices which comprise the memory cells; therefore, variations in the programming speed of different memory cells will typically occur. This results in memory cells that become programmed faster than others and the possibility that some memory cells will be programmed to a different state than intended due to over-shooting the desired threshold voltage level ranges. Additionally, as memory cells are subjected to cycles of programming and erasing, there can be a tendency for the programming speed to increase. Faster programming of multiple memory cells can result in over-shooting desired threshold voltage level ranges, producing errors in the data being stored. This concept of over-shooting the desired amount of programming is referred to as over programming.

Typically, when data is being programmed, the verify process for the memory system will guarantee that the threshold voltage of the memory cell is higher than a minimum level. However, memory systems typically do not guarantee an upper limit on the threshold voltage. Thus, over programming which raises the threshold voltage beyond the range for the desired data state can occur without being noticed. Over programming can cause the memory cell to store incorrect data, thereby, causing an error during subsequent read operations. More information about over programming can be found in U.S. Pat. Nos. 5,321,699; 5,386,422; 5,469,444; 6,134,140 and 5,602,789.

BRIEF DESCRIPTION OF THE DRAWINGS

Like-numbered elements refer to common components in the different figures.

FIG. 4D depicts a view of the select gate layers and word line layers.

FIG. 14 is a flow chart describing one embodiment of a process for programming non-volatile memory.

FIG. 17A depicts threshold voltage distributions.

FIG. 17B depicts threshold voltage distributions.

FIG. 17C depicts threshold voltage distributions.

FIG. 17D depicts threshold voltage distributions.

DETAILED DESCRIPTION

It is proposed that a non-volatile storage system include a mechanism to compensate for over programming during the programming process. That is, after the programming process starts for a set of data and target memory cells, and prior to the programming process completing for the set of data and the target memory cells, the system determines whether a first group of the memory cells has more than a threshold number of over programmed memory cells. If so, then the system adjusts the programming process, mid-way through the programming process, to reduce the number of programming errors. One example of a means for adjusting the programming process to reduce the number of programming errors is to reduce the step size of a programming signal. Another example of a means for adjusting the programming process to reduce the number of programming errors is to increase the target voltages for the programming process.

Figure 1:
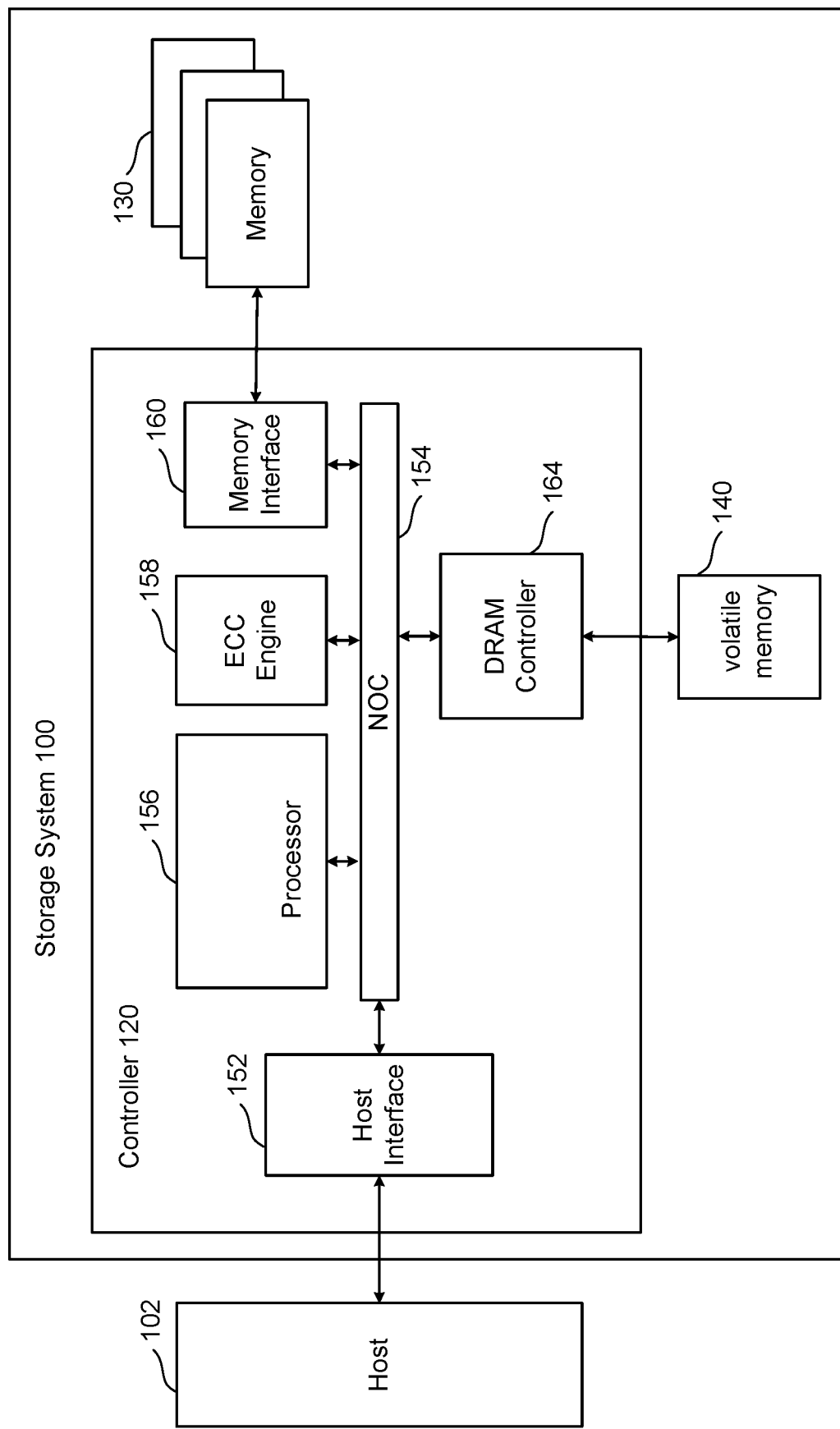
FIG. 1 is a block diagram depicting one embodiment of a memory system.

FIG. 1 is a block diagram of one embodiment of a memory system 100 that implements the proposed technology, including countermeasures for avoiding unrecoverable errors due to over programming. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
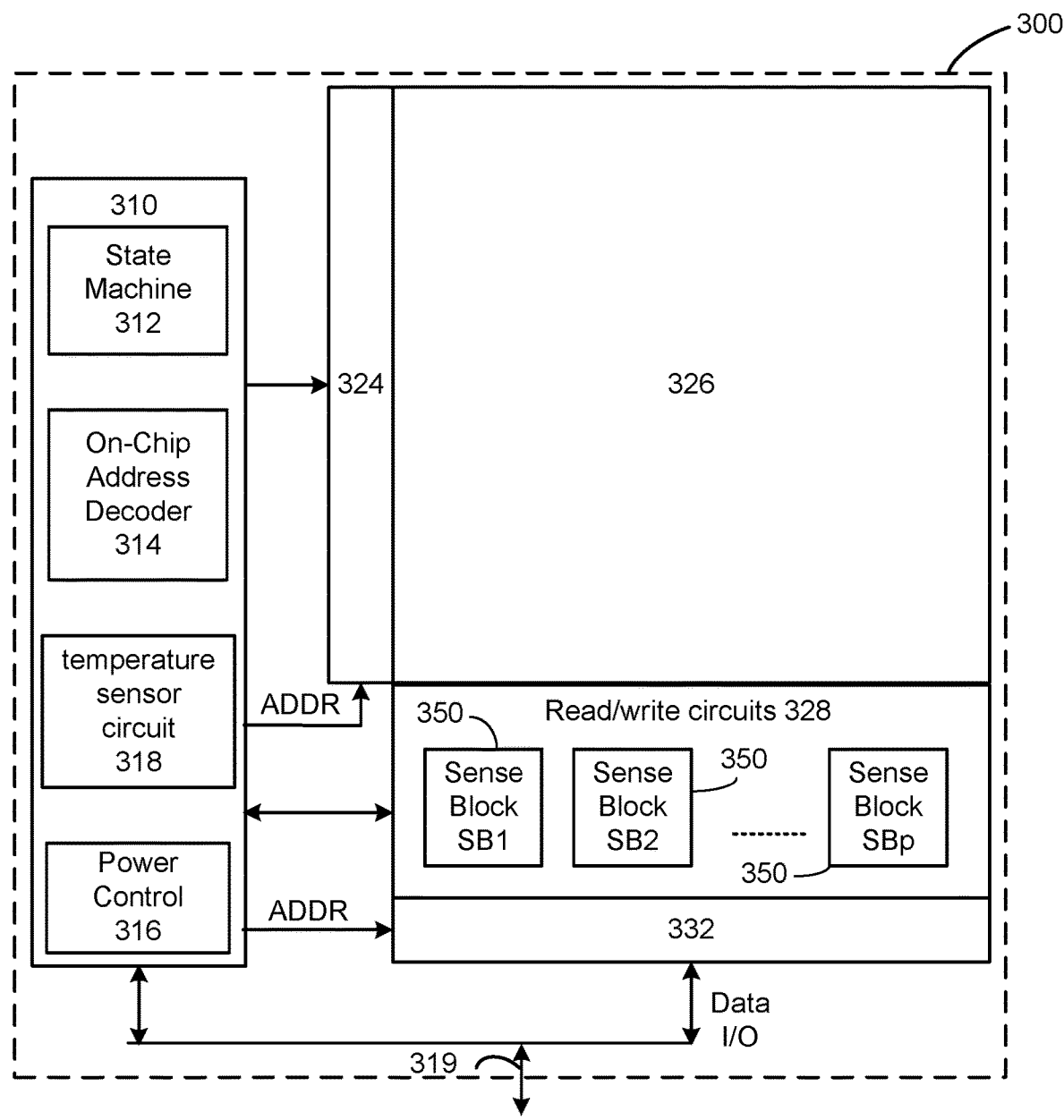
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit. In some embodiments, the controller in combination with control circuitry 310, read/write circuits 328 and decoders 324/332 comprise one embodiment of a control circuit. In another embodiment, state machine 312 comprises the control circuit. In another embodiment, the host can provide the control circuit.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
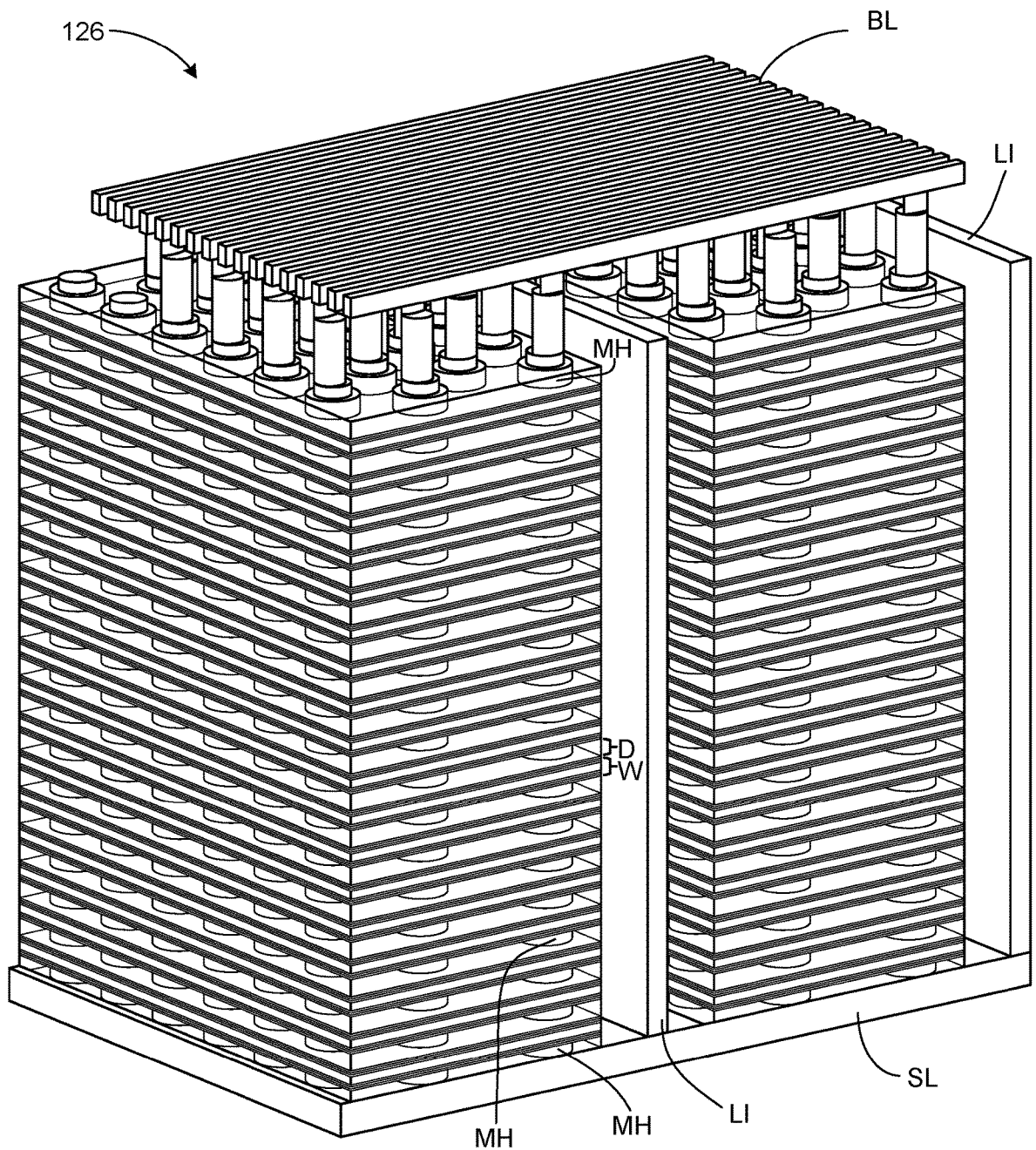
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4F.

Figure 4A:
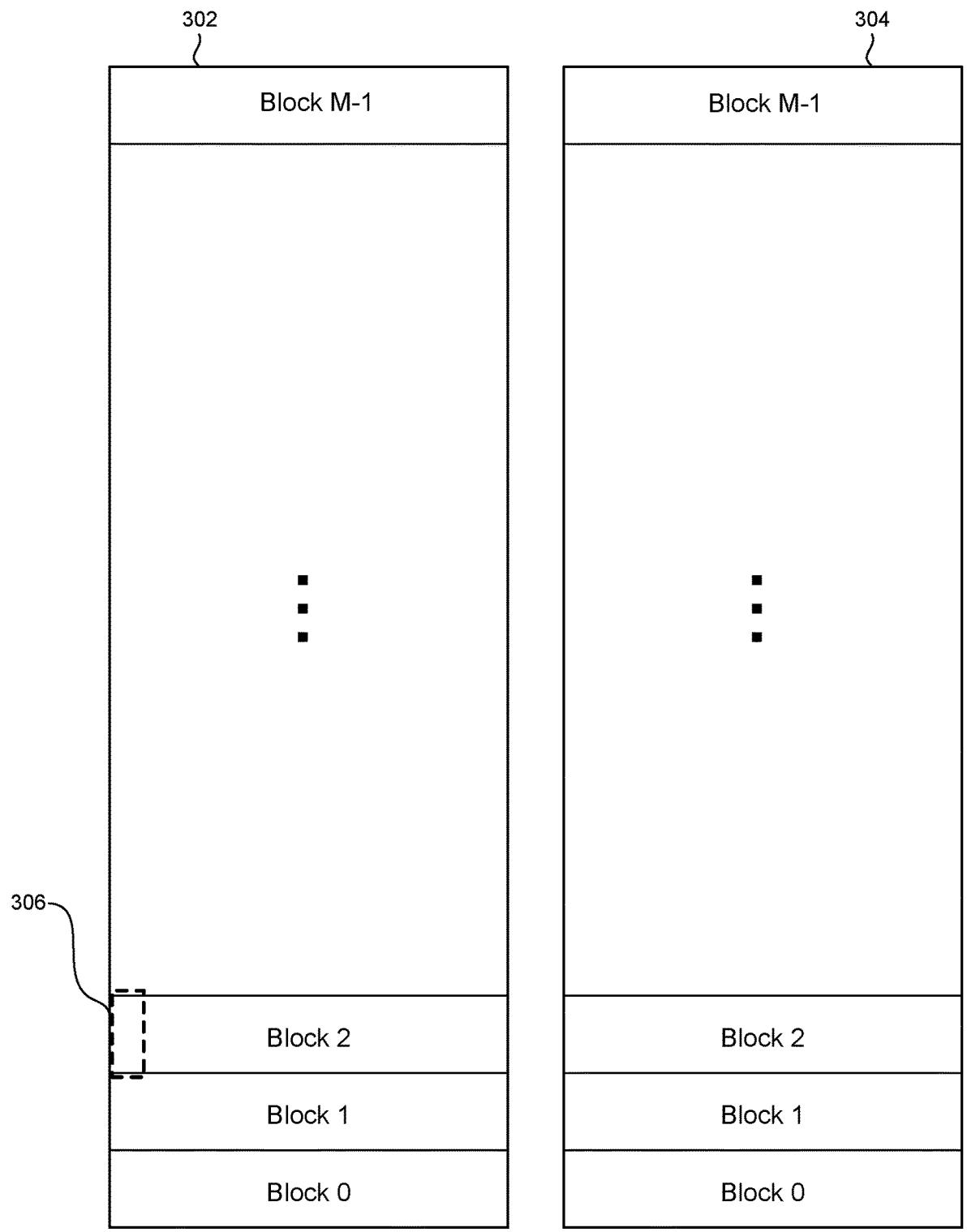
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
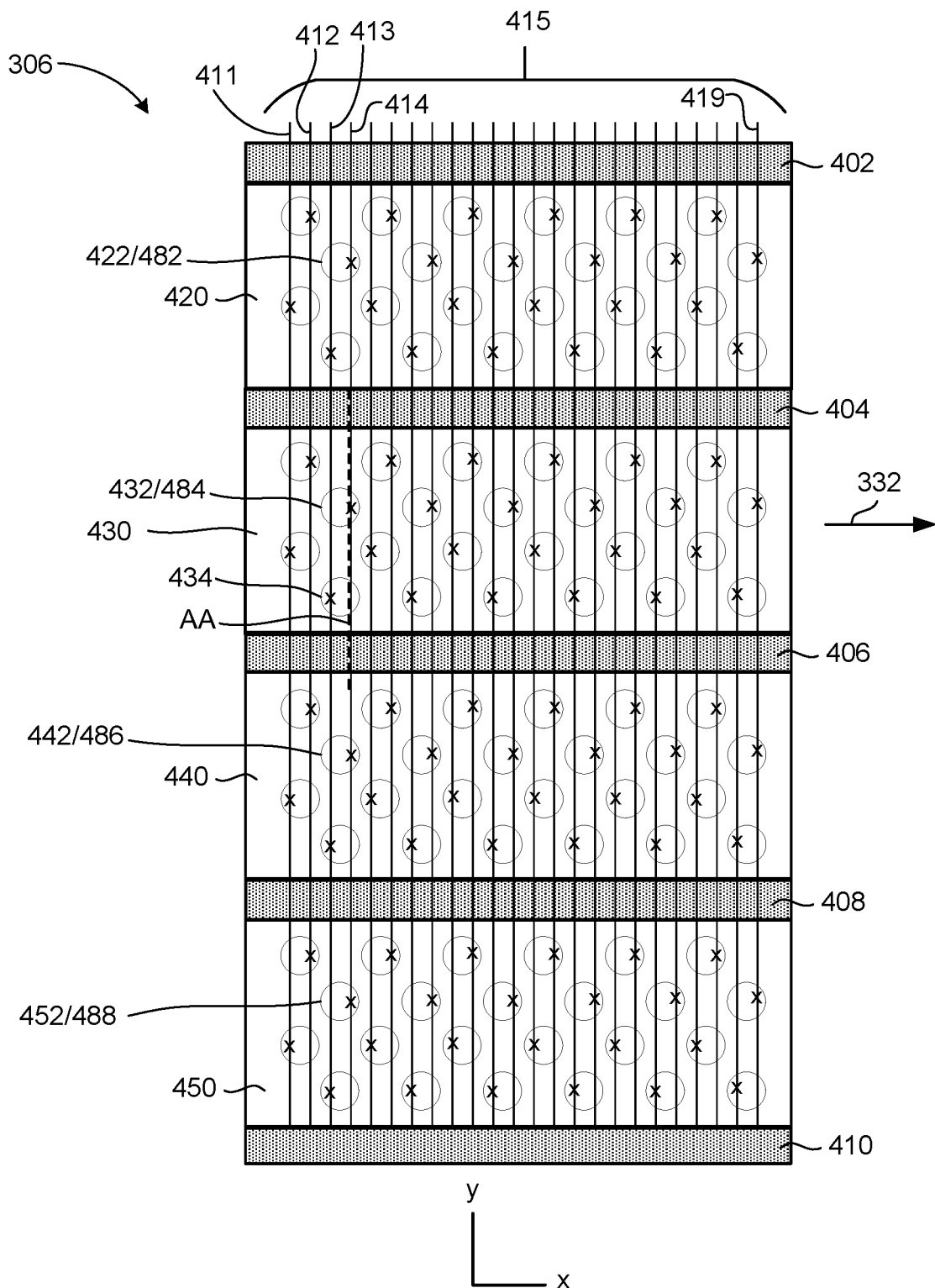
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
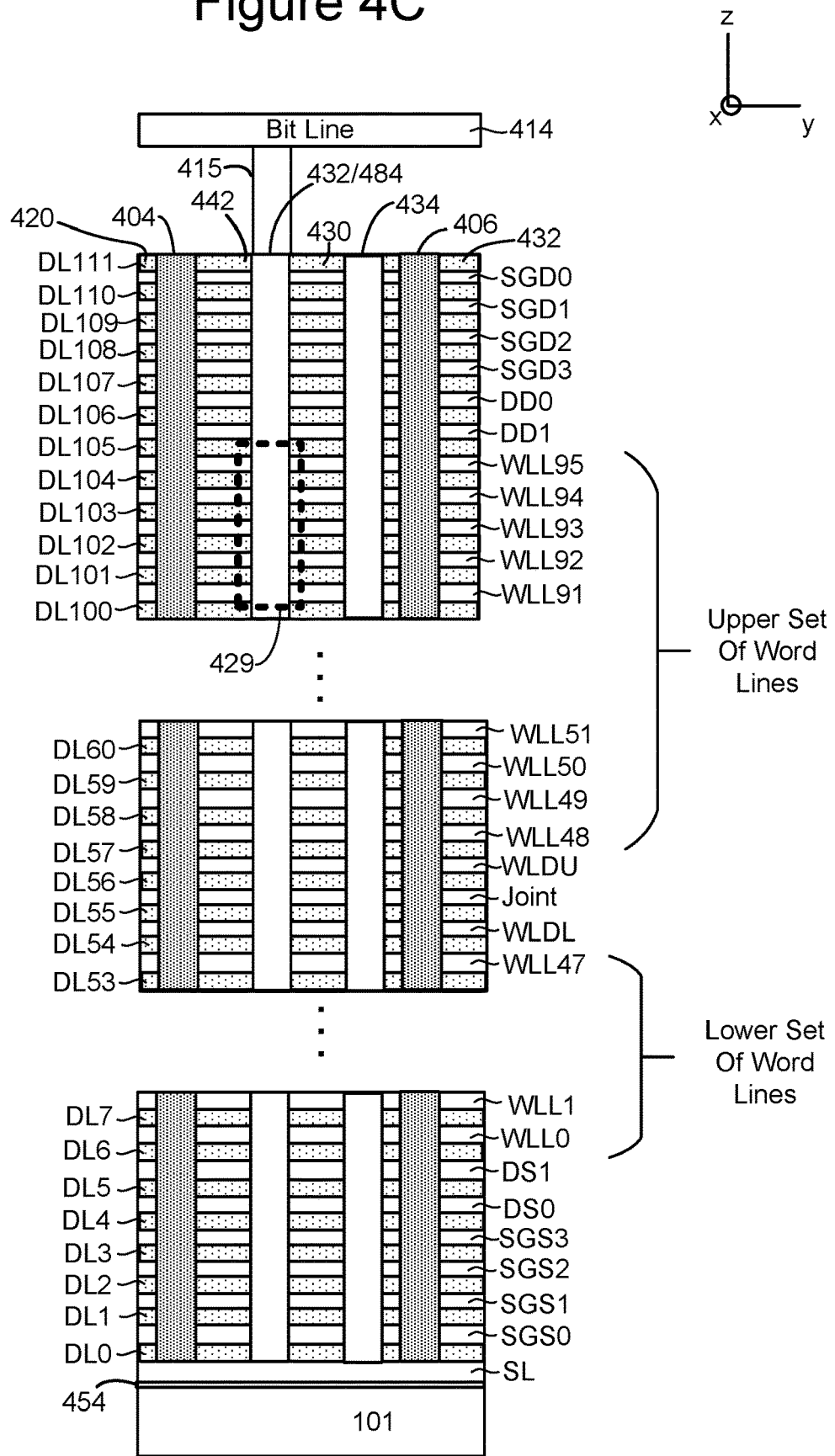
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
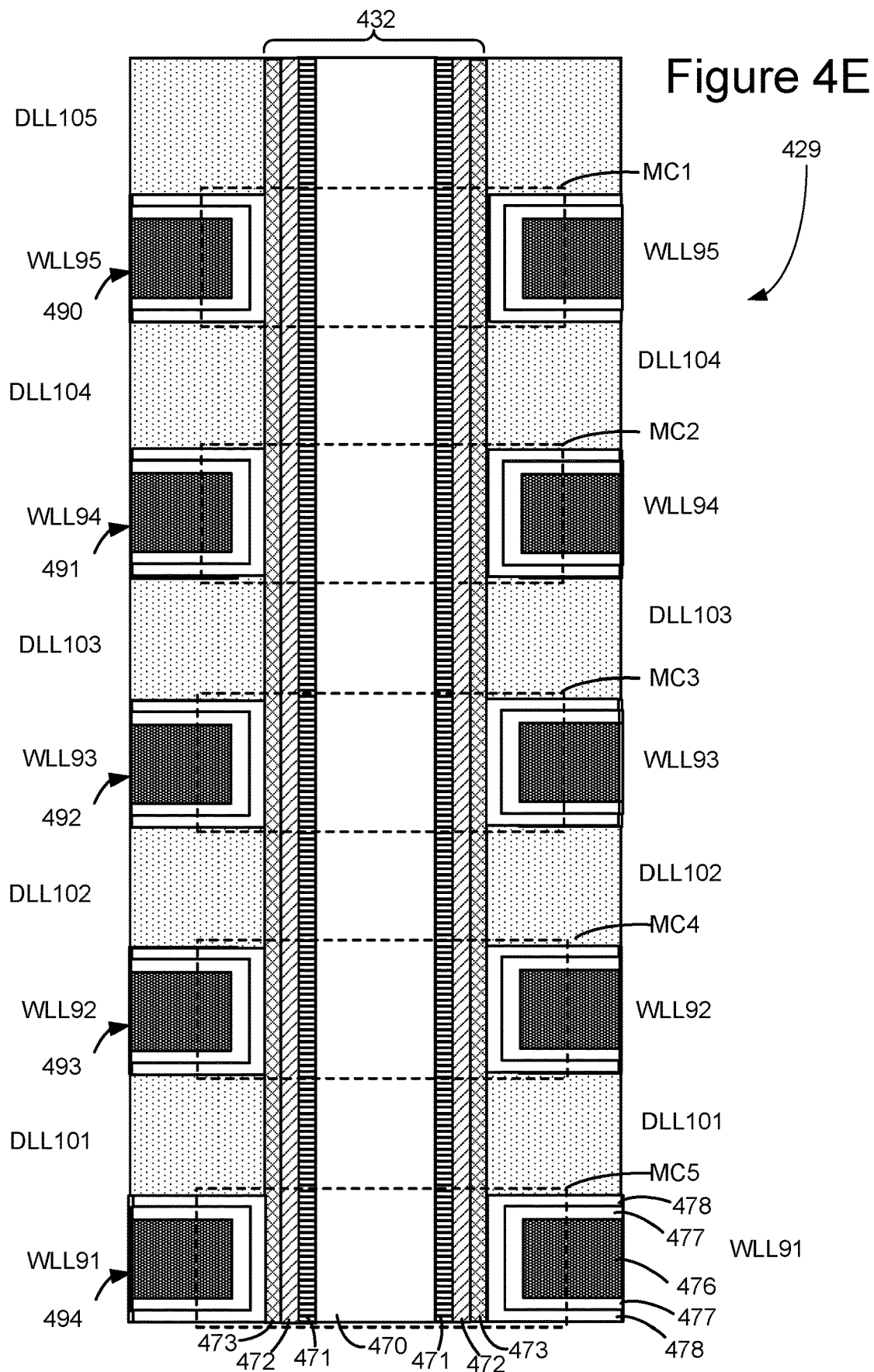
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
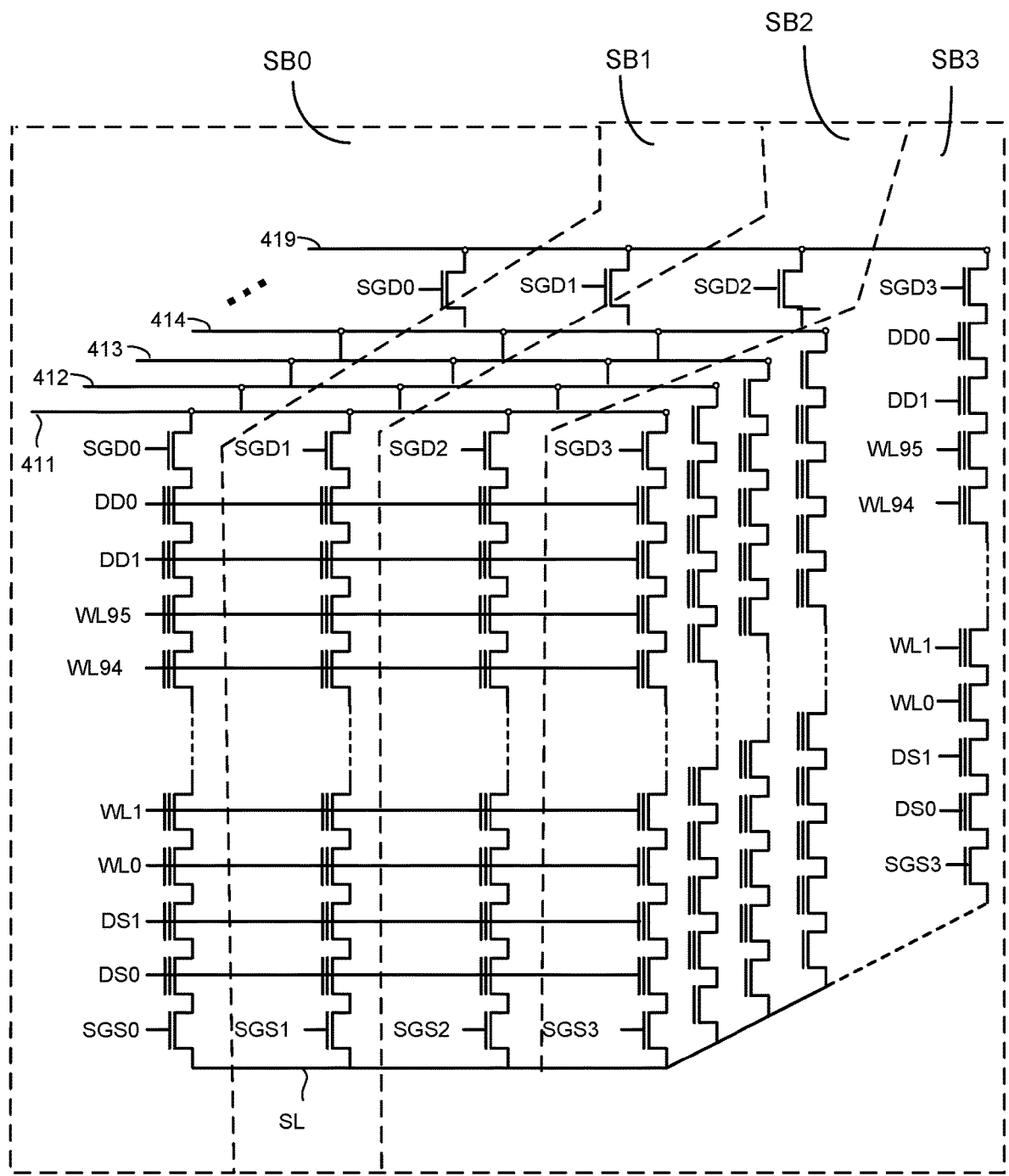
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

Figures 5, 6:
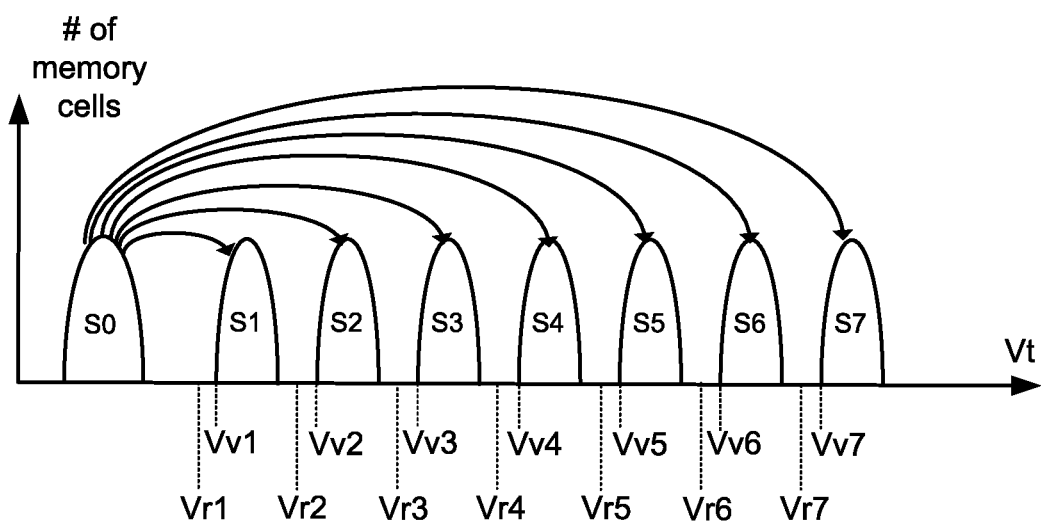
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

As discussed above, it is possible that memory cells can become over programmed. For example, consider the example of a memory cell intended to be programmed to data state S4. The programming process is designed to increase the threshold voltage of the memory cell from the threshold voltage distribution for data state S0 to data S4 by applying a programming signal as a set of programming pulses that increase in magnitude by a step size and testing between program pulses as to whether the memory cell's threshold voltage has reached Vv4. However, due to a structural variation or increase in programming speed due to program/erase cycling, it is possible that when the memory cell's threshold voltage has reached Vv4 it has also surpassed Vr5, which may lead to an error when reading the memory cell later. This is one example of over programming. If a small number of memory cells become over programmed, the ECC process during reading may be able to correct the errors. However, if too many memory cells are over programmed or have errors, then the ECC may not be able to correct all of the errors and the reading process may fail, resulting in loss of data.

To prevent loss of data, it is proposed that the non-volatile storage system include a mechanism to compensate for over programming during the programming process. That is, after the programming process starts for a set of data and target memory cells and prior to the programming process completing for the set of data and the target memory cells, the system determines whether there is more than a threshold number of over programmed memory cells and, if so, then the system adjusts the programming process mid-way through the programming process (e.g., in-flight) to compensate for the over programming that has occurred so far in the currently being performed programming process.

Figure 7:
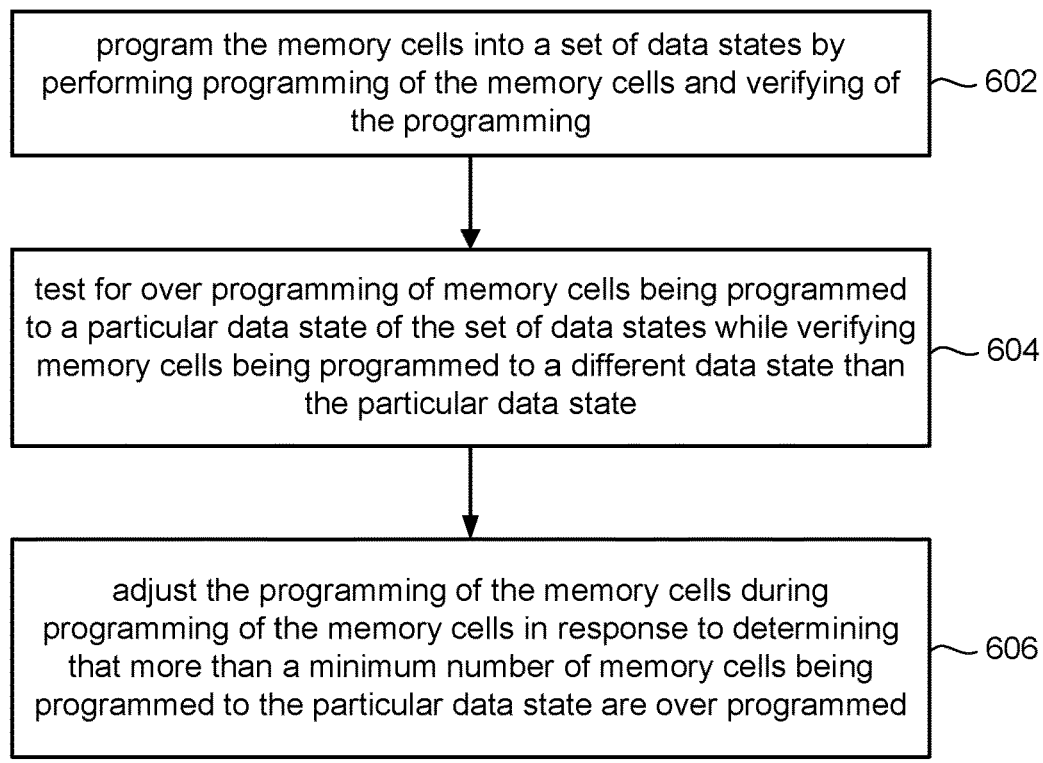
FIG. 7 is a flow chart describing one embodiment of a process for programming non-volatile memory.

FIG. 7 is a flow chart describing one embodiment of a process for programming non-volatile memory that compensates for over programming during the programming process, as proposed herein. In one embodiment, the process of FIG. 7 is performed by any of the embodiments of a control circuit. In one example, the process of FIG. 7 is performed by state machine 312 operating on non-volatile memory structure 326. In another example, all or a portion of the process of FIG. 7 is performed by a controller or other processor. In step 602 of FIG. 7, the control circuit programs the memory cells into a set of data states (see FIG. 5) by performing programming of the memory cells and verifying of the programming.

In step 604, the control circuit tests for over programming of memory cells being programmed to a particular data state of the set of data states while verifying memory cells being programmed to a different data state than the particular data state. One embodiment includes, while performing verification for data state N of the set of data states (see FIG. 5), the system determines whether memory cells being programmed to data state N-1 of the set of data states are over programmed. For example, while performing verification for data state S5 using Vv5, the system determines whether memory cells being programmed to data state S4 of the set of data states are over programmed. In one example, memory cells being programmed to data state S4 are over programmed if their threshold voltage is greater than Vr5. In another example, memory cells being programmed to data state S4 are over programmed if their threshold voltage is greater than the threshold voltages of S4 (as depicted in FIG. 5).

In step 606, the control circuit adjusts the programming of the memory cells during programming of the memory cells in response to determining that more than a minimum number of memory cells being programmed to the particular data state are over programmed. One example of adjusting the programming process includes reducing the step size of a programming signal. Another example of adjusting the programming process includes increasing the target voltages for the programming process. In another embodiment, the adjustment to the programming process is only performed for data to a same page as the page of data that is experiencing over programming (more details are explained below with respect to FIGS. 16 and 17A-D).

Figure 8:
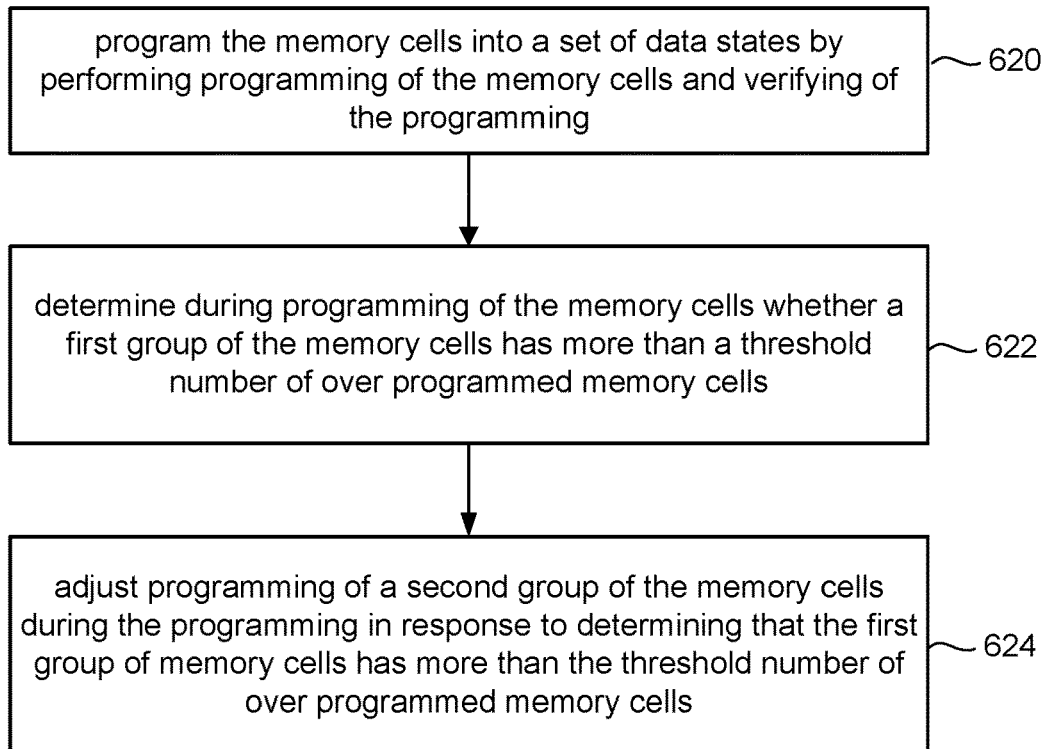
FIG. 8 is a flow chart describing one embodiment of a process for programming non-volatile memory.

FIG. 8 is a flow chart describing another embodiment of a process for programming non-volatile memory that compensates for over programming during the programming process, as proposed herein. In one embodiment, the process of FIG. 8 is performed by any of the embodiments of a control circuit. In one example, the process of FIG. 8 is performed by state machine 312 operating on non-volatile memory structure 326. In another example, all or a portion of the process of FIG. 8 is performed by a controller or other processor. In step 620 of FIG. 8, the control circuit programs the memory cells into a set of data states (see FIG. 5) by performing programming of the memory cells and verifying of the programming. In step 622, the control circuit determines during programming of the memory cells whether a first group of the memory cells has more than a threshold number of over programmed memory cells. In step 624, the control circuit adjusts programming of a second group of the memory cells during the programming in response to determining that the first group of memory cells has more than the threshold number of over programmed memory cells. For example, while performing verification for memory cells being programmed to data state N of the set of data states, the system determines whether memory cells being programmed to data state N-1 of the set of data states are over programmed (step 622). The memory cells being programmed to data state N-1 are an example of the first group, while the other memory cells not yet finished programming are an example of the second group. Another example of the second group are all memory cells being programmed to data states above data state N-1, memory cells being programmed to a subset of data states above data state N-1, or another subset of memory cells that have not yet completed programming and are being programmed to data states above data state N-1. One example of adjusting the programming process includes reducing the step size of a programming signal. Another example of adjusting the programming process includes increasing the target voltages for the programming process. In another embodiment, the adjustment to the programming process is only performed for data to a same page as the page of data that is experiencing over programming (more details are explained below with respect to FIGS. 16 and 17A-D).

Figure 9:
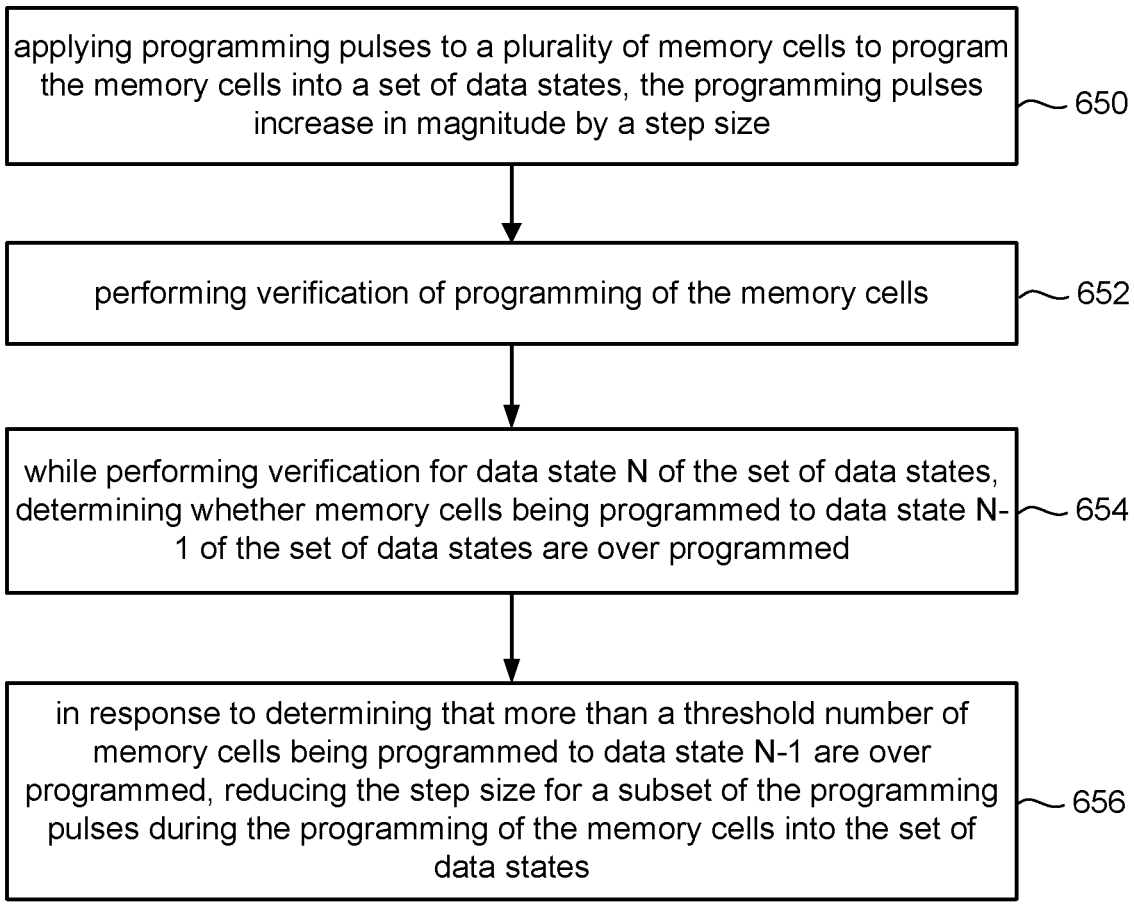
FIG. 9 is a flow chart describing one embodiment of a process for programming non-volatile memory.

FIG. 9 is a flow chart describing one embodiment of a process for programming non-volatile memory that compensates for over programming during the programming process, as proposed herein. In one embodiment, the process of FIG. 9 is performed by any of the embodiments of a control circuit. In one example, the process of FIG. 9 is performed by state machine 312 operating on non-volatile memory structure 326. In another example, all or a portion of the process of FIG. 9 is performed by a controller or other processor. FIG. 9 represents an example implementation of the process of FIG. 7 and/or an example implementation of the process of FIG. 8. Step 650 of FIG. 9 includes applying programming pulses (e.g., voltage pulses) to a plurality of memory cells to program the memory cells into a set of data states. The programming pulses increase in magnitude by a step size. Step 652 includes performing verification of programming of the memory cells. Steps 650 and 652 are an example implementation of a step 602 and/or step 620. Step 654 includes, while performing verification for data state N of the set of data states, determining whether memory cells being programmed to data state N-1 of the set of data states are over programmed. For example, while performing verification for data state S4 using Vv4, the system determines whether memory cells being programmed to data state S3 of the set of data states are over programmed. In one embodiment, a single sensing process is used to verify memory cells being programmed to data state N and test for over programming of memory cells being programmed to data state N−1. By single sensing process, it is meant that one word line voltage is applied to the memory cells connected to a common word line and the sense amplifiers connected to the bit lines sense for verification and over programming in response to that same word line voltage (e.g., by using different bit line voltages, using different sense timing or other means). Step 656 includes, in response to determining that more than a threshold number of memory cells being programmed to data state N−1 are over programmed, reducing the step size for a subset of the programming pulses during the programming of the memory cells into the set of data states.

Figure 10A:
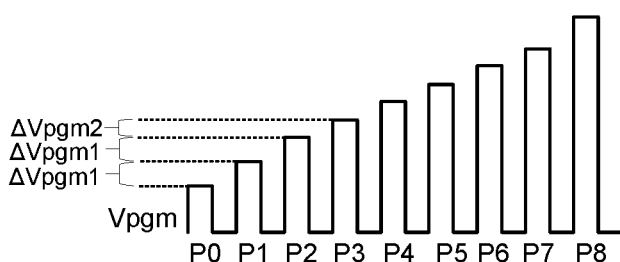
FIG. 10A depicts a programming signal comprising a series of voltage pulses that increase in magnitude by a first step size and then by a second step size.
Figure 10:
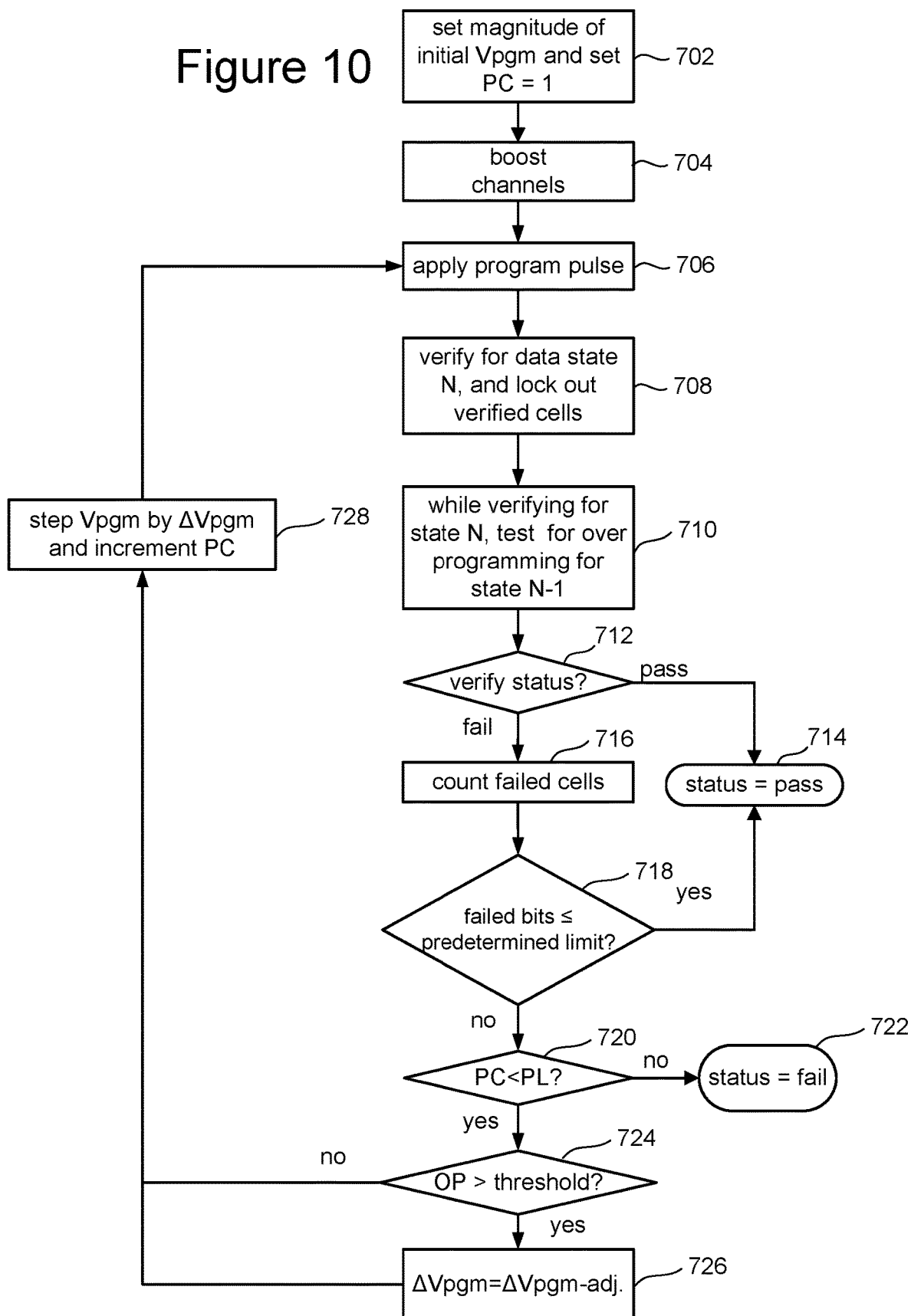
FIG. 10 is a flow chart describing one embodiment of a process for programming non-volatile memory.

FIG. 10 is a flowchart describing one embodiment of a process for programming. The process of FIG. 10 is one detailed example implementation of the process of FIG. 9. Other example implementations can also be used. In one example embodiment, the process of FIG. 10 is performed on memory die 300 using any embodiment of the control circuit discussed above. For example, the process of FIG. 10 can be performed at the direction of state machine 312. The process of FIG. 10 can also be used to implement the full sequence programming discussed above. Additionally, the process of can be used to implement each phase/stage of a multi-phase (or multi-stage) programming process.

Typically, the program voltage applied to the control gates (via a selected word line) during a program operation is applied as a series of program pulses (voltage pulses). Between programming pulses are a set of verify pulses (voltage pulses) to perform verification. In many implementations, the magnitude of the program pulses is increased with each successive program pulse by a predetermined step size. In step 702 of FIG. 10, the programming voltage (Vpgm) is initialized to the starting magnitude (e.g., ~12-20V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 so they will not be programmed. Additionally, as memory cells reach their intended target data state, they will be inhibited from further programming. Those NAND strings that include memory cells connected to the selected word line that are to be inhibited from programming have their channels boosted to inhibit programming in step 704. When a channel has a boosted voltage, the voltage differential between the channel and the word line is not large enough to cause programming. In one embodiment, unselected word lines receive one or more boosting voltages (e.g., ~7-11 volts) to perform boosting schemes known in the art.

In step 706, a program pulse of the programming signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to Vdd to inhibit programming. In step 706, the program pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming. In one embodiment, steps 704 and 706 are performed concurrently.

In step 708, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage. Step 708 corresponds to step 652 of FIG. 9.

Step 710 includes, while performing verification for data state N of the set of data states, determining whether memory cells being programmed to data state N−1 of the set of data states are over programmed. Step 710 corresponds to step 604 of FIG. 7, step 622 of FIG. 8, and step 654 of FIG. 9.

In step 712, it is determined whether all the memory cells have reached their target threshold voltages (pass). If so, the programming process is complete and successful because all selected memory cells were programmed and verified to their target states. A status of "PASS" is reported in step 714. If, in step 712, it is determined that not all of the memory cells have reached their target threshold voltages (fail), then the programming process continues to step 716.

In step 716, the memory system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 718, it is determined whether the count from step 716 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 714. In this situation, enough memory cells programmed correctly such that the few remaining memory cells that have not been completely programmed can be corrected using ECC during the read process. In some embodiments, the predetermined limit used in step 718 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 720 and the program counter PC is checked against the program limit value (PL). Examples of program limit values include 6, 7, 12, 16, 20 and 30; however, other values can be used. If the program counter PC is not less than the program limit value PL, then the program process is considered to have failed and a status of FAIL is reported in step 722. If the program counter PC is less than the program limit value PL, then the process continues at step 724.

In step 724, it is determined whether the number of memory cells found to be over programmed in step 710 is greater than a threshold number of memory cells. In one example, the system determines whether more than ten memory cells were found in step 710 to be over programmed. In other embodiments, threshold number of memory cells can be a number less than or greater than ten. If the system determines that less than the threshold number of memory cells were found in step 710 to be over programmed, the process continues at step 728. If more than the threshold number memory cells were found in step 710 to be over programmed, then in step 726 the step size $\Delta Vpgm$ is reduced by an adjustment value ($\Delta Vpgm=\Delta Vpgm-adj.$). In one embodiment, $\Delta Vpgm$ is initially set as $\Delta Vpgm=0.7$ v, and the adjustment value is 0.05 volts; therefore, step 726 includes reducing the step size ($\Delta Vpgm$) from 0.7 v to 0.65 v. In other embodiments, other magnitudes of an adjustment value can be used. In step 728, the Program Counter PC is incremented by 1 and the programming voltage Vpgm is increased in magnitude by the step size $\Delta Vpgm$ to the next magnitude ($Vpgm=Vpgm+\Delta Vpgm$). For example, the next pulse will have a magnitude greater than the previous pulse by the step size. After step 728, the process loops back to step 706 and another program pulse is applied to the selected word line so that another iteration (steps 706-728) of the programming process of FIG. 10 is performed.

In one embodiment, the adjustment (adj.) made to the step size $\Delta Vpgm$ in step 726 is a static predetermined amount. In another embodiment, the adjustment (adj.) made to the step size $\Delta Vpgm$ in step 726 is determined dynamically based on an operating condition of the memory system or the memory structure 326, such as current temperature, number of program-erase cycles, number of over programmed memory cells, etc. In some embodiment, the adjustment (adj.) made to the step size $\Delta Vpgm$ in step 726 is the same for every data state, while in other embodiments different data states will get different adjustments to the step size.

In one embodiment, once the answer to step 724 is "yes", then step 724 will not be performed in later iterations of FIG. 10 during the same programming process, while in other embodiments step 724 will be repeated again during the same programming process.

FIG. 10A explains and provides an example of step 726 of FIG. 10. FIG. 10A depicts an example of a programming signal Vpgm, with a set of program (voltage) pulses P0, P1, P2, P3, P4, P5, P6, P7, P8 that increase in magnitude by a step size and are applied to the memory cells via the selected word line during iterations of step 706 (one pulse per iteration of step 706). In the example of FIG. 10A, the step size $\Delta Vpgm$ starts out at $\Delta Vpgm=\Delta Vpgm1$. In this example, after program pulse P2, then the system determines in step 724 that more than the threshold number memory cells were found in step 710 to be over programmed; therefore, the step size $\Delta Vpgm$ is reduced to $\Delta Vpgm2$ prior to program, pulse P3, where $\Delta Vpgm1>\Delta Vpgm2$ (e.g., $\Delta Vpgm2=\Delta Vpgm1-adj$).

As described above, the system performs verification between programming pulses. A brute force method will apply a separate verify voltage pulse for each verify reference voltage. However, time is consumed in performing the verify tests. For example, typically, a verify test involves applying a verification signal to the control gates of the selected memory cells via a selected word line, pre-charging sense circuits which are connected to the selected memory cells via respective bit lines and observing an amount of discharge in the sense circuits for a specified discharge period. This can be repeated for each verify voltage reference voltage. Moreover, the time consumed will increase as the number of data states increases.

A smart verify scheme can be defined in which the number of verify tests is optimized, e.g., by avoiding unnecessary verify tests. The verify test for a data state should be skipped until the upper tail of the threshold voltage distribution of memory cells being programmed approaches the verify voltage of the data state. One approach is to specify based on empirical data, which verify tests are to be performed in which program-verify iterations. Techniques can also be implemented to adaptively determine when to begin verify tests for a particular data state based on a programming progress of a set of memory cells. In one approach, a count is made in a program-verify iteration of memory cells which pass a verify test of a state N. The count is used to determine a subsequent program-verify iteration in which to perform a verify test of a higher state, N+k, where k is a positive integer, e.g., 1, 2, . . . . Moreover, the subsequent program-verify iteration can be determined adaptively as a function of an amount by which the count exceeds a threshold count. If the amount is relatively small, the Vth distribution of the memory cells assigned to the N+k state is relatively far from the verify voltage of the N+k state, so that a number of program-verify iterations to skip before the subsequent program-verify iteration is relatively large. If the amount is relatively large, the Vth distribution of the memory cells assigned to the N+k state is relatively close to the verify voltage of the N+k state, so that a number of program-verify iterations to skip before the subsequent program-verify iteration is relatively small.

In another embodiment, the verify test can be turned on for state N when at least one memory cells successfully verifies for state N−1 and the verify test can be turned off for state N when all memory cells being programmed to state N are successfully programmed or less than a predetermined number of memory cells are in error.

Examples of smart verify processes can be found in U.S. Pat. Nos. 7,073,103; 7,301,817; 9,142,302; 9,564,226; and 10,014,063.

Figure 11:
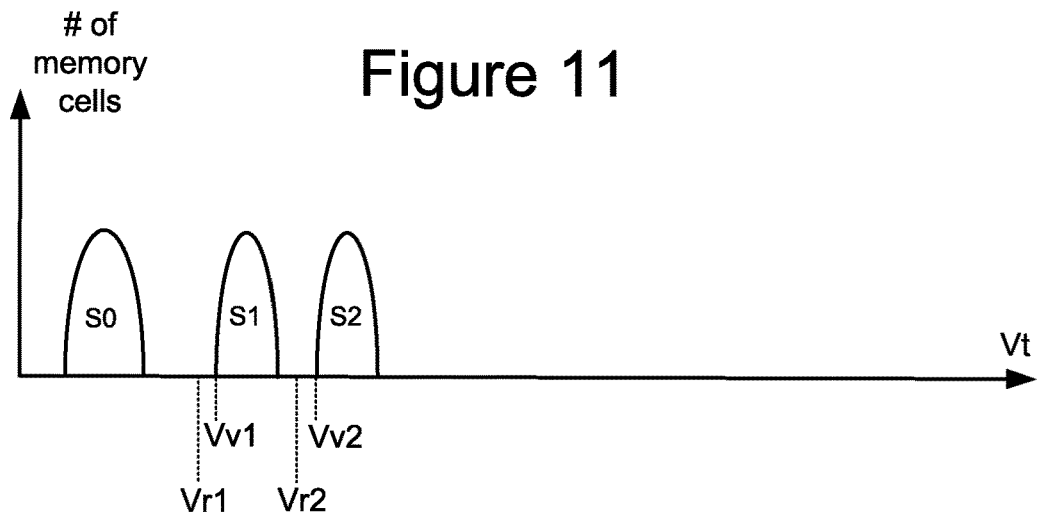
FIG. 11 depicts threshold voltage distributions.
Figure 12A:
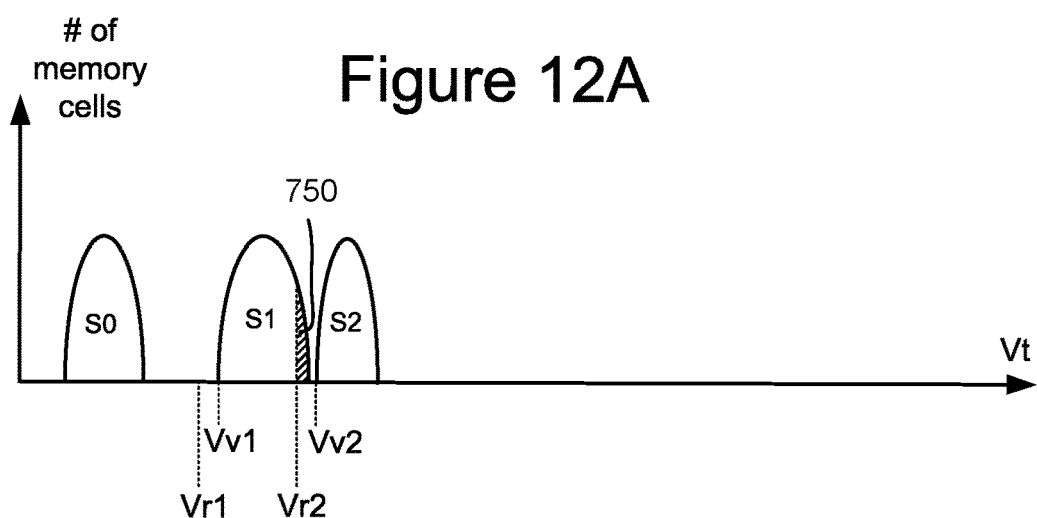
FIG. 12A depicts threshold voltage distributions.
Figure 12B:
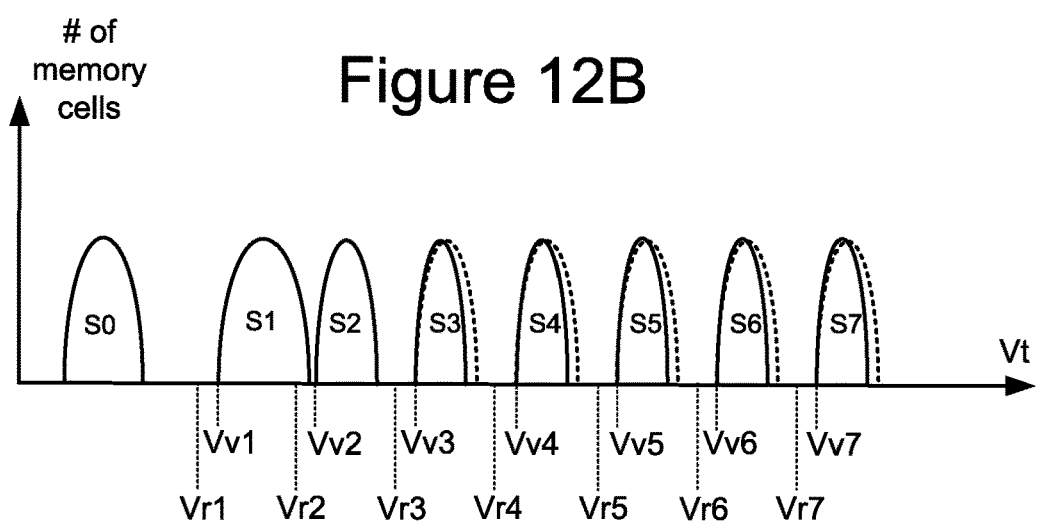
FIG. 12B depicts threshold voltage distributions.

FIGS. 11, 12A and 12B, which depict threshold voltage distributions for a population of memory cells being programmed concurrently, provide examples for the process of FIG. 10. In each case, the system is using a smart verify process that only verifies a subset of data states between a pair of program pulses. In one embodiment, the system starts the program process by only verifying for state S1. After one program pulse, another number of program pulses or some memory cells successfully verify for state S1, the system starts verifying for data state S2. FIG. 11 shows threshold voltage distributions for data state S0 (erased memory cells), data state S1 and data state S2. At this point in the process of FIG. 10, the system is only verifying in step 708 for data state S2. The memory cells programmed to data state S1 are not over programmed; therefore, step 724 has a "no" result and the process continues after step 724 to step 728 and there is no change to the step size at this point.

FIG. 12A shows threshold voltage distributions for data state S0 (erased memory cells), data state S1 and data state S2. At this point in the process of FIG. 10, in this example of FIG. 12A, the system is only verifying in step 708 for data state S2. FIG. 12A shows that more than a threshold number of memory cells programmed to data state S1 are over programmed, as the threshold voltage distribution for data state S1 is wider than in FIG. 11. A portion of the threshold voltage distribution for data state S1 (shaded and marked by reference number 750) is above read reference voltages Vr2 and represents the over programmed memory cells. Because in step 724 of FIG. 10 the system will conclude that there are more than a threshold number of memory cells programmed to data state S1 that are over programmed, the process of FIG. 10 will continue from step 724 to step 726, resulting in the step size ΔVpgm being reduced for the remaining program pulses of the current programming process. For example, FIG. 10A shows the program pulses for one programming process. After pulse P2 and before pulse P3, the step size ΔVpgm is reduced from ΔVpgm1 to ΔVpgm2, and then remains at ΔVpgm2 for the remainder of the current programming process (i.e. the remainder of the iterations of the process of FIG. 10). FIG. 12B depicts the threshold voltage distributions at the end of the programming process for this example. The solid lines represent the threshold voltage distributions from the programming (including some data states using a smaller step size). The dashed lines represent hypothetical threshold voltage distributions if the step size was never changed (and is only included for comparison purposes). Because the step size ΔVpgm was reduced due to over programming of data state S1, the later programmed data states that used the new reduced step size have narrower threshold voltage distributions. That is, using a small step size results in narrower threshold voltage distributions, and narrower threshold voltage distributions results in less programming errors. So this example compensates for more programming errors in memory cells being programmed to data state S1 by reducing the number of programming errors in memory cells being programmed to data states S3-S7. In some embodiments, data state S2 can also be made narrower. Thus, the system (e.g., control circuit) is configured to reduce the step size for the programming pulses during the programming process in response to determining during the programming process that at least a minimum amount of memory cells are over programmed in order to reduce over programming after reducing the step size. In summary, FIG. 12B shows one example of the result of the processes of FIGS. 7, 8, 9 and/or 10.

Figure 13:
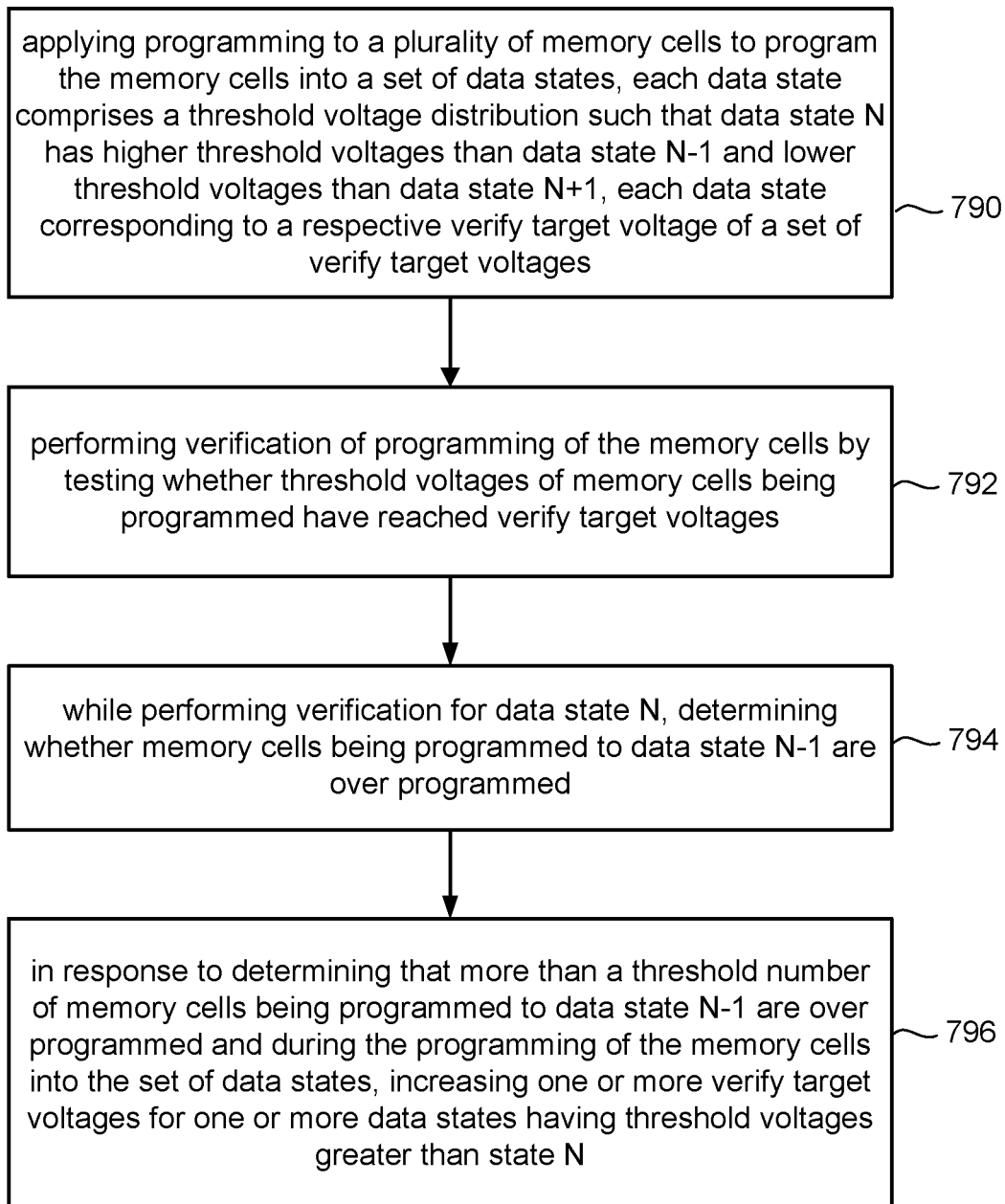
FIG. 13 is a flow chart describing one embodiment of a process for programming non-volatile memory.

As discussed above, one example of adjusting the programming in step 606 of FIG. 7 and step 624 of FIG. 8 is to increase the verify reference voltages. FIG. 13 is a flow chart describing one embodiment of a process for programming non-volatile memory that compensates for over programming during the programming process by increasing the verify reference voltages. In one embodiment, the process of FIG. 13 is performed by any of the embodiments of a control circuit. In one example, the process of FIG. 13 is performed by state machine 312 operating on non-volatile memory structure 326. In another example, all or a portion of the process of FIG. 13 is performed by a controller or other processor. FIG. 13 represents an example implementation of the process of FIG. 7 and/or an example implementation of the process of FIG. 8. When representing an example implementation of the process of FIG. 8, the first group of memory cells are being programmed to a first data state of a set of data states and the second group of memory cells are being programmed to one or more additional data states, other than the first data state, after programming completes for the first data state and prior to completion of the programming of the memory cells.

Step 790 of FIG. 13 includes applying programming to a plurality of memory cells to program the memory cells into a set of data states. Each data state comprises a threshold voltage distribution such that data state N has higher threshold voltages than data state N−1 and lower threshold voltages than data state N+1 (see FIG. 5). Each data state corresponding to a respective verify target voltage of a set of verify target voltages. Step 792 includes performing verification of programming of the memory cells by testing whether threshold voltages of memory cells being programmed have reached verify target voltages. Step 794 includes, while performing verification for data state N, determining whether memory cells being programmed to data state N−1 are over programmed. Step 796 includes, in response to determining that more than a threshold number of memory cells being programmed to data state N−1 are over programmed and during the programming of the memory cells into the set of data states, increasing one or more verify target voltages (also referred to as target voltages or verify reference voltages) for one or more data states having threshold voltages greater than state N.

FIG. 14 is a flowchart describing one embodiment of a process for programming. The process of FIG. 14 is one detailed example implementation of the process of FIG. 13. Other example implementations can also be used. In one example embodiment, the process of FIG. 14 is performed on memory die 300 using any embodiment of the control circuit discussed above. For example, the process of FIG. 14 can be performed at the direction of state machine 312. The process of FIG. 14 can also be used to implement the full sequence programming discussed above. Additionally, the process of can be used to implement each phase/stage of a multi-phase (or multi-stage) programming process.

In step 802 of FIG. 14, the programming voltage (Vpgm) is initialized to the starting magnitude and the program counter PC maintained by state machine 312 is initialized at 1 (similar to step 702). Those NAND strings that include memory cells connected to the selected word line that are to be inhibited from programming have their channels boosted to inhibit programming in step 804 (similar to step 704). In step 806, a program pulse of the programming signal Vpgm is applied to the selected word line (similar to step 706). In step 808, the appropriate memory cells are verified using the appropriate set of verify reference voltages to perform one or more verify operations (similar to step 708). Step 806 corresponds to step 790 of FIG. 13. Step 808 corresponds to step 792 of FIG. 13. In one embodiment, a smart verify scheme is used, as discussed above. Step 810 includes, while performing verification for data state N of the set of data states, determining whether memory cells being programmed to data state N−1 of the set of data states are over programmed (similar to step 710). Step 810 corresponds to step 604 of FIG. 7, step 622 of FIG. 8, and step 794 of FIG. 13.

In step 812, it is determined whether all the memory cells have reached their target threshold voltages (pass). If so, the programming process is complete and successful because all selected memory cells were programmed and verified to their target states. A status of "PASS" is reported in step 814. If, in step 812, it is determined that not all of the memory cells have reached their target threshold voltages (fail), then the programming process continues to step 816.

In step 816, the memory system counts the number of memory cells that have not yet reached their respective target threshold voltage distribution. In step 818, it is determined whether the count from step 816 is less than or equal to a predetermined limit (similar to step 718). If the number of failed cells is less than or equal to the predetermined limit, than the programming process can stop and a status of "PASS" is reported in step 814. If number of failed memory cells is not less than the predetermined limit, than the programming process continues at step 820 and the program counter PC is checked against the program limit value (PL). If the program counter PC is not less than the program limit value PL, then the program process is considered to have failed and a status of FAIL is reported in step 822. If the program counter PC is less than the program limit value PL, then the process continues at step 824.

In step 824, it is determined whether the number of memory cells found to be over programmed in step 810 is greater than a threshold number of memory cells. In one example, the system determines whether more than ten (for example) memory cells were found in step 810 to be over programmed. If not, the process continues at step 828. If more than the threshold number memory cells were found in step 810 to be over programmed, then in step 826 the programming process is adjusted by changing the verify reference voltages (i.e. target voltages or target programming voltages). In one embodiment, the system only changes the verify reference voltages. In another embodiment, the system changes (e.g. increases) the verify reference voltages and changes (e.g., decreases) the step size ΔVpgm. FIG. 14 shows step 826 including the step size ΔVpgm being reduced by an adjustment value (ΔVpgm=ΔVpgm−adj.) and the verify reference voltages being increased by a value δ. In one embodiment, δ=25 mV; however, other values can also be used. In one embodiment, the voltage differential between the bottom of S0 and the top of D7 is 6.5 volts; however, other ranges can also be used. In other embodiments, adjusting the programming can include changing other parameters, such as boosting levels, read reference voltages, overdrive voltages used during a read process, pass voltages, sense timing, etc.

In one embodiment, the adjustment made to the verify reference voltages in step 826 is a static predetermined amount. In another embodiment, the adjustment made to the verify reference voltages in step 826 is determined dynamically based on an operating condition of the memory system or the memory structure 326, such as current temperature, number of program-erase cycles, number of over programmed memory cells, etc. In some embodiment, the adjustment made to the verify reference voltages in step 826 is the same for every data state, while in other embodiments different data states will get different adjustments to the verify reference voltages. In some embodiment, the adjustment made to the verify reference voltages in step 826 is for every data state above N−1, while in other embodiments only a subset of those data states will get adjustments to the verify reference voltages.

In step 828 the Program Counter PC is incremented by 1 and the programming voltage Vpgm is increased in magnitude by the step size ΔVpgm to the next magnitude (Vpgm=Vpgm+ΔVpgm). After step 828, the process loops back to step 806 and another program pulse is applied to the selected word line so that another iteration (steps 806-828) of the programming process of FIG. 14 is performed.

In one embodiment, once the answer to step 824 is "yes" then step 824 will not be performed in later iterations of FIG. 14 during the same programming process, while in other embodiments step 824 will be repeated again during the same programming process.

Figure 15A:
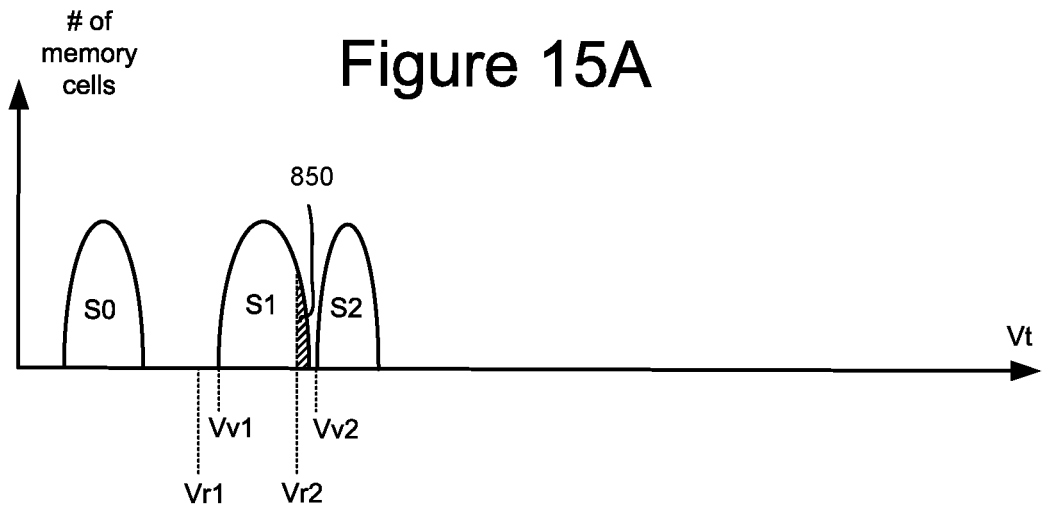
FIG. 15A depicts threshold voltage distributions.
Figure 15B:
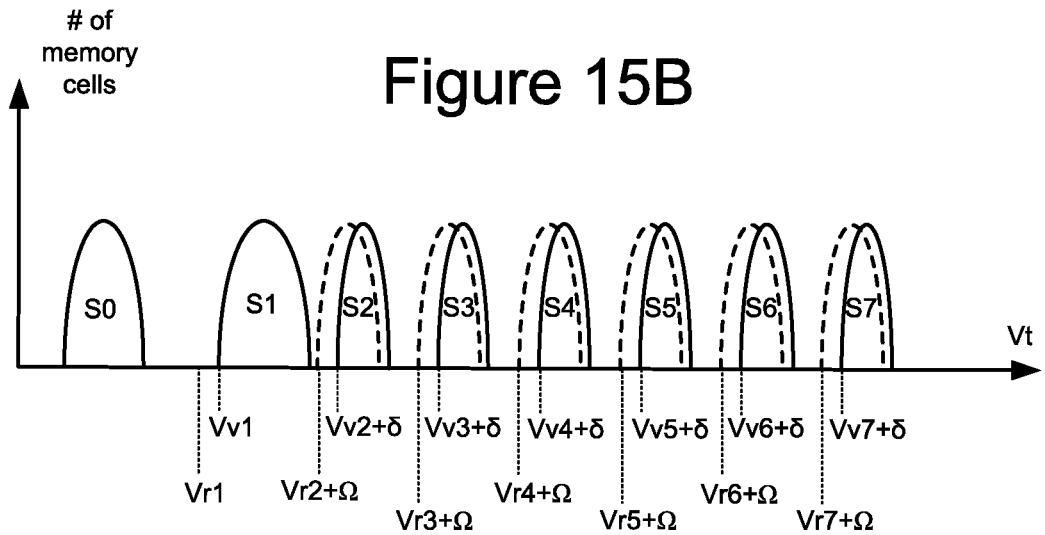
FIG. 15B depicts threshold voltage distributions.

FIGS. 15A and 15B, which depict threshold voltage distributions for a population of memory cells being programmed concurrently, provide examples for the process of FIG. 14. FIG. 15A shows threshold voltage distributions for data state S0 (erased memory cells), data state S1 and data state S2. At this point in the process of FIG. 14, the system is only verifying in step 808 for data state S2, as part of a smart verify scheme. FIG. 15A shows that more than a threshold number of memory cells programmed to data state S1 are over programmed, as the threshold voltage distribution for data state S1 is wider than in FIG. 5. A portion of the threshold voltage distribution for data state S1 (shaded and marked by reference number 850) is above read reference voltages Vr2 and represents the over programmed memory cells. Because in step 824 of FIG. 14 the system will conclude that more than a threshold number of memory cells programmed to data state S1 are over programmed, the process of FIG. 14 will continue from step 824 to step 826, resulting in the step size ΔVpgm being reduced (optionally) and the verify reference voltages being increased for the remaining verify reference pulses of the current programming process. FIG. 15B depicts the threshold voltage distributions at the end of the programming process for this example. The solid lines represent the threshold voltage distributions from the programming (including some data states using a smaller step size). The dashed lines represent hypothetical threshold voltage distributions if the programming was not adjusted (and are only included for comparison purposes). Because the step size ΔVpgm was reduced due to over programming of data state S1, the later programmed data states that used the new reduced step size have narrower threshold voltage distributions. Because the verify reference voltages were increased by δ, the threshold voltage distributions for S2-S7 have been shifted to the right by δ volts. As described above, the change in step size and change in verify reference voltages are made mid-programming.

In one embodiment, the system also increases the read reference voltages. For example, FIG. 15A shows the read reference voltages Vr2, Vr3, Vr4, Vr5, Vr6 and Vr7 increased by Ω volts to Vr2+Ω, Vr3+Ω, Vr4+Ω, Vr5+Ω, Vr6+Ω and Vr7+Ω. In one embodiment, Ω=δ. In other embodiment, Ω can be less than or greater than δ.

As can be seen from FIG. 15B, the shifting of the threshold voltage distribution for data state S2 and the shifting of Vr2 effectively reduces the errors from the over programming of memory cells programmed to data state S1 as the threshold voltage distribution for data state S1 is now below Vr2 and not overlapping with data state S2.

In one embodiment, each of the memory cells store multiple bits of data in multiple pages and reading a page of the multiple pages comprises testing threshold voltage between a subset of data states. For example, FIG. 6 (described above) is a table that depicts one example encoding of three bits of data into a population of memory cells that implement eight data states. The data is divided into three pages: upper page, middle page and lower page. It is not necessary to performing sensing at all seven read reference voltages Vr1-Vr7 to read a single page of data. For example, to read the lower page of data sensing operations can be performed at Vr1 and Vr5; to read the middle page of data sensing operations can be performed at Vr2, Vr4 and Vr6; and to read the upper page of data sensing operations can be performed at Vr3 and Vr7. Thus, each page of data is said to have a testing group of read reference voltages. The testing group of read reference voltages for the lower page is Vr1 and Vr5; the testing group of read reference voltages for the middle page is Vr2, Vr4 and Vr6; and the testing group of read reference voltages for the upper page is Vr3 and Vr7. In one embodiment, the adjustment to the programming in steps 606, 624, 656, 726, 796, and 826 are only performed, or only started, when programming/verifying to a data state adjacent a read reference voltage for the same testing group as the data state that is over programmed. For example, if memory cells being programmed to S1 are over programmed, then it is the middle page that is failing, so the adjustment to programming can start at data state S3 as it is adjacent to Vr4 (middle page testing group is Vr2, Vr4 and Vr6). If memory cells being programmed to S2 are over programmed, then it is the upper page that is failing, so the adjustment to programming can start at data state S6.

Figure 16:
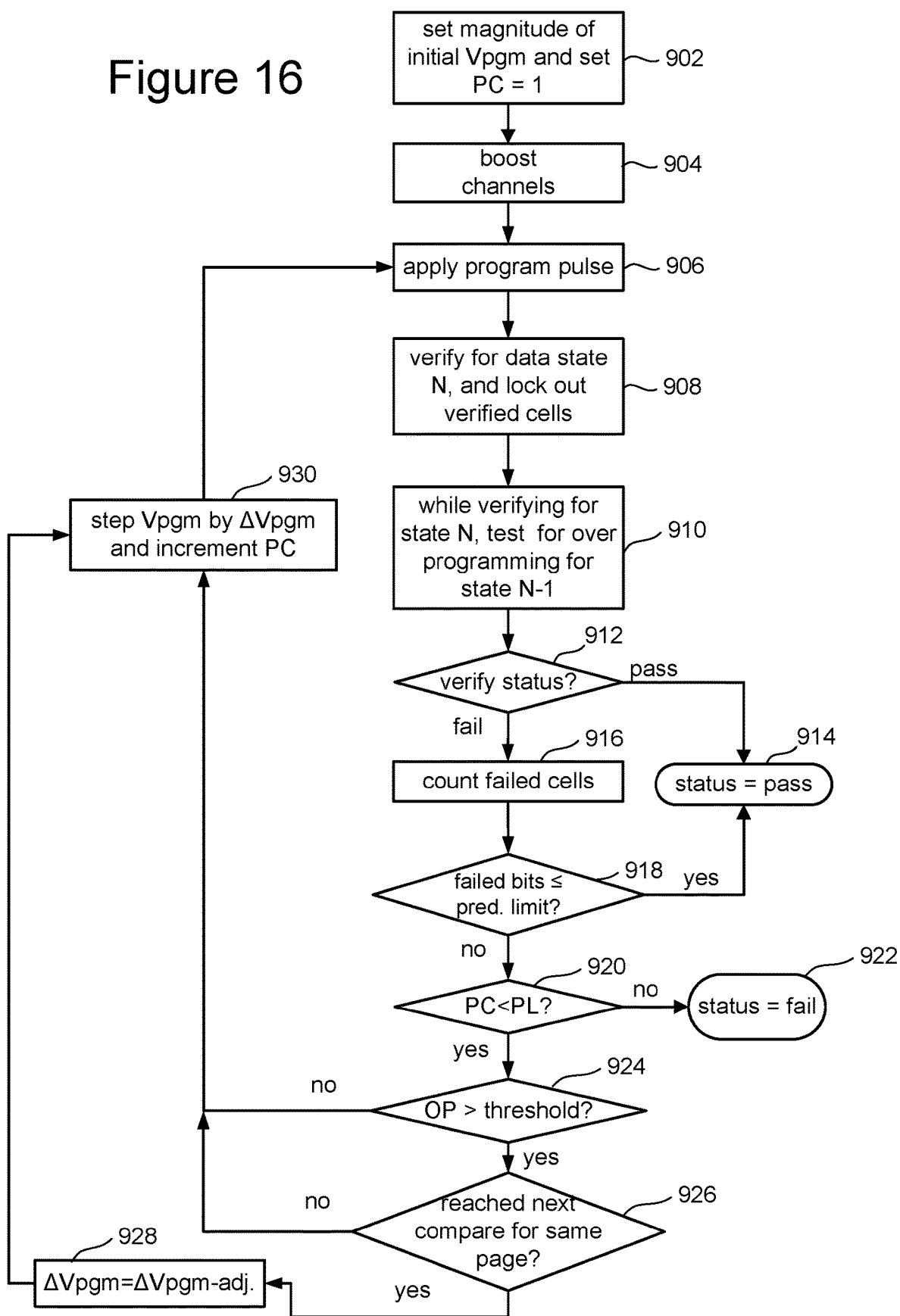
FIG. 16 is a flow chart describing one embodiment of a process for programming non-volatile memory.

FIG. 16 is a flowchart describing one embodiment of a process for programming in which the adjustment to the programming in steps 606, 624, 656, 726, 796, and 826 are performed, or started, when programming/verifying to a data state adjacent a read reference voltage for the same testing group as the data state that is over programmed. The process of FIG. 16 represents an alternative embodiment to the process of FIG. 10. The process of FIG. 16 is one detailed example implementation of the process of FIG. 9. In one example embodiment, the process of FIG. 16 is performed on memory die 300 using any embodiment of the control circuit discussed above. For example, the process of FIG. 16 can be performed at the direction of state machine 312. The process of FIG. 16 can also be used to implement the full sequence programming discussed above. Additionally, the process of can be used to implement each phase/stage of a multi-phase (or multi-stage) programming process.

In step 902 of FIG. 16, the programming voltage (Vpgm) is initialized to the starting magnitude and a program counter PC maintained by state machine 312 is initialized at 1 (similar to step 702). Those NAND strings that include memory cells connected to the selected word line that are to be inhibited from programming have their channels boosted to inhibit programming in step 904 (similar to step 704). In step 906, a program pulse of the programming signal Vpgm is applied to the selected word line (similar to step 706). In step 908, the appropriate memory cells are verified using the appropriate set of verify reference voltages to perform one or more verify operations (similar to step 708). For example, when using a smart verify scheme, verification is performed for memory cells being programmed to state N. Step 910 includes, while performing verification for data state N of the set of data states, determining whether memory cells being programmed to data state N−1 of the set of data states are over programmed (similar to step 710).

In step 912, it is determined whether all the memory cells have reached their target threshold voltages (pass). If so, the programming process is complete and successful because all selected memory cells were programmed and verified to their target states. A status of "PASS" is reported in step 914. If, in step 912, it is determined that not all of the memory cells have reached their target threshold voltages (fail), then the programming process continues to step 916 and the memory system counts the number of memory cells that have not yet reached their respective target threshold voltage distribution. In step 918, it is determined whether the count from step 916 is less than or equal to a predetermined limit. If the number of failed cells is less than or equal to the predetermined limit, than the programming process can stop and a status of "PASS" is reported in step 914. If number of failed memory cells is not less than the predetermined limit, than the programming process continues at step 920 and the program counter PC is checked against the program limit value (PL). If the program counter PC is not less than the program limit value PL, then the program process is considered to have failed and a status of FAIL is reported in step 922. If the program counter PC is less than the program limit value PL, then the process continues at step 924.

In step 924, it is determined whether the number of memory cells found to be over programmed in step 910 is greater than a threshold number of memory cells. In one example, the system determined whether more than ten memory cells were found in step 810 to be over programmed. If not, then the process continues at step 930. If more than the threshold number memory cells were found in step 910 to be over programmed, then in step 926 it is determined whether the system is verifying (as part of the smart verifying scheme) a data state adjacent a read reference voltage for the same testing group as the data state that is over programmed. If not, then the process continues at step 930 with no adjustment to the programming at this point in time. If so, then in step 928, the current programming process is adjusted by changing the step size ΔVpgm (similar to step 726). For example, the step size ΔVpgm is reduced by an adjustment value (ΔVpgm=ΔVpgm−adj.). In other embodiments, adjusting the programming can include changing other parameters, as discussed above. The adjustments can be static or dynamic, and the same for each state or different for each state, as discussed above. The adjustment can be for all higher states or a subset of higher states.

In step 930, the Program Counter PC is incremented by 1 and the programming voltage Vpgm is increased in magnitude by the step size ΔVpgm to the next magnitude (Vpgm=Vpgm+ΔVpgm). After step 930, the process loops back to step 906 and another program pulse is applied to the selected word line so that another iteration (steps 906-930) of the programming process of FIG. 16 is performed.

In one embodiment, once the answer to step 924 is "yes" then step 924 will not be performed in later iterations of FIG. 16 during the same programming process, while in other embodiments step 924 will be repeated again during the same programming process.

In the process of FIG. 16, is necessary for the system to keep track of whether an adjustment will have to be made at a later point in time. There can be a mechanism to remember that more than a threshold number of memory cells have been found to be over programmed and for what page. In one embodiment there is a set of three flags that indicate that over programming was detected. The first flag indicates that over programming was detected for the lower page. The second flag indicates that over programming was detected for the middle page. The third flag indicates that over programming was detected for the upper page. Then, when performing steps 924-928, the system can check the flags to see whether over programming was found and for which page. In one embodiment, for example, when the system starts the verify operations for a certain data state, it checks if one of the corresponding over programming flags had been set earlier. If so, then changes to ΔVpgm need to be activated.

The process of FIG. 16 includes adjusting the programming when programming/verifying to a data state adjacent to a read reference voltage for the same testing group as the data state that is over programmed. In one embodiment, the adjustment starts when programming/verifying to a data state adjacent to a read reference voltage for the same testing group as the data state that is over programmed, and the adjustment continues until the programming process ends.

In another embodiment, the adjustment is only performed for programming/verifying to data states adjacent to and below a read reference voltage for the same testing group as the data state that is over programmed. In another embodiment, the adjustment is only performed for programming/verifying to a subset of data states adjacent to a read reference voltage for the same testing group as the data state that is over programmed.

FIGS. 17A-D, which depict threshold voltage distributions for a population of memory cells being programmed concurrently, provide examples for the process of FIG. 16 and the various embodiments discussed above. FIG. 17A shows threshold voltage distributions for data state S0 (erased memory cells), data state S1 and data state S2. At this point in the process of FIG. 16, the system is only verifying in step 908 for data state S2, as part of a smart verify scheme. FIG. 17A shows that more than a threshold number of memory cells programmed to data state S1 are over programmed, as the threshold voltage distribution for data state S1 is wider than in FIG. 5. A portion of the threshold voltage distribution for data state S1 (shaded and marked by reference number 950) is above read reference voltage Vr2 and represents the over programmed memory cells. Because in step 924 of FIG. 16 the system will conclude that more than a threshold number of memory cells programmed to data state S1 are over programmed, the process of FIG. 16 will continue from step 924 to step 926. When programming and verifying for data state S2, the decision at step 926 will be that the process is at a different page (not programming/verifying to a data state adjacent a read reference voltage for the same testing group as the data state that is over programmed), resulting in the process of FIG. 16 proceeding from step 926 to step 930 without making the adjustment to programming. When programming and verifying for data state S3, the decision at step 926 will be that the process is programming/verifying to a data state adjacent a read reference voltage for the same testing group as the data state that is over programmed, resulting in the process of FIG. 16 proceeding from step 926 to step 928 and starting the adjustment to the programming process (resulting in the step size ΔVpgm being reduced). FIG. 17B depicts the threshold voltage distributions at the end of the programming process for this example. The solid lines represent the threshold voltage distributions from the programming (including some data states using a smaller step size). The dashed lines represent hypothetical threshold voltage distributions if the programming was not adjusted (and are only included for comparison purposes). Because the step size ΔVpgm was reduced due to over programming of data state S1, the later programmed data states S3-S7 that used the new reduced step size have narrower threshold voltage distributions.

FIG. 17C depicts the threshold voltage distributions at the end of the programming process for another embodiment associated with the example of FIG. 17A. In the embodiment of FIG. 17C, the adjustments are started when programming/verifying to a data state adjacent a read reference voltage for the same testing group as the data state that is over programmed, but not for all such data states. In the example of FIG. 17A, the over programmed page is the middle page. The testing group of read reference voltages for the middle page is Vr2, Vr4 and Vr6. The embodiment of FIG. 17B starts the adjustment to programming for Vr4 (at S3). The embodiment of FIG. 17C starts the adjustment to programming for Vr6 (at S5). Because the step size ΔVpgm was reduced due to over programming of data state S1, the later programmed data states S6-S7 that used the new reduced step size have narrower threshold voltage distributions; therefore, there should be a reduction in errors when reading at Vr6 (which is in the same testing group as Vr2).

FIG. 17D depicts the threshold voltage distributions at the end of the programming process for another embodiment associated with the example of FIG. 17A. In the embodiment of FIG. 17D, the adjustments are only made when programming/verifying to a data state adjacent and below a read reference voltage for the same testing group as the data state that is over programmed. In the example of FIG. 17A, the over programmed page is the middle page. The testing group of read reference voltages for the middle page is Vr2, Vr4 and Vr6. The embodiment of FIG. 17D performs the adjustment only for memory cells being programmed to data states S3 (for Vr4) and S5 (for Vr6). Thus, because the step size ΔVpgm was reduced due to over programming of data state S1, the later programmed data states S3 and S5 that used the new reduced step size have narrower threshold voltage distributions thereby reducing errors when reading at Vr4 and/or Vr6 (which are in the same testing group as Vr2).

In some embodiments, step 928 of FIG. 16 can include changing the verify reference voltages and/or changing (e.g., increasing) the read reference voltages (or changing other programming parameters) instead of or in addition to changing the step size ΔVpgm. In an embodiment where step 928 of FIG. 16 includes increasing the verify reference voltages instead of the step size ΔVpgm, then the changing of the verify reference voltages (also referred to as target verify voltages) is started at the data state adjacent to and above a read reference voltage for the same testing group as the data state that is over programmed. For the example of over programming in FIG. 17A (and analogous to the example of FIG. 17B), data states S4-S7 would have the higher verify reference voltages (also target verify voltages). In an alternative analogous to FIG. 17C, data states S6-S7 would have the higher verify reference voltages (also target verify voltages). In an alternative analogous to FIG. 17D, data states S4 and S6 would have the higher verify reference voltages (also target verify voltages). The adjustment of the verify reference voltage starts at the data state above read reference voltage for the same testing group as the data state that is over programmed because a goal is to maintain a sufficiently large valley between data states that includes the read reference voltage for the same testing group as the data state that is over programmed.

The above discussion provides multiple embodiments for compensating for over programmed memory cells during the programming process. These embodiments will result in a reduction of errors in the data so that the data can be properly read back.

One embodiment includes a non-volatile storage apparatus comprising a plurality of memory cells and a control circuit connected to the memory cells. The control circuit is configured to program the memory cells into a set of data states by performing programming of the memory cells and verifying of the programming. The control circuit is configured to test for over programming of memory cells being programmed to a particular data state of the set of data states while verifying memory cells being programmed to a different data state than the particular data state. The control circuit is configured to adjust the programming of the memory cells during programming of the memory cells in response to determining that more than a minimum number of memory cells being programmed to the particular data state are over programmed.

In one embodiment, the control circuit is configured to perform programming by applying a set of programming pulses to the memory cells that increase in magnitude by a step size and the control circuit is configured to adjust programming of the memory cells during programming of the memory cells by changing the step size after starting to apply the set of programming pulses and prior to completing the set of programming pulses in order to narrow one or more data states other than the particular data state.

In one embodiment, the control circuit is configured to adjust programming of the memory cells during programming of the memory cells by increasing one or more verify target voltages for one or more data states. The increase of the verify target voltages can be the same for multiple data states or different for different data states. The increase of the verify target voltages can be static or dynamic based on an operating condition of the apparatus. The updated verify target voltages are used to complete the programming process.

In one embodiment, each of the memory cells store multiple bits of data in multiple pages, reading a page of the multiple pages comprises testing threshold voltage between a subset of data states, reading a first page of the multiple pages comprises testing threshold voltage between the particular data state and the adjacent data state as well as testing between a first additional data state and a second additional data state, and the control circuit is configured to adjust programming of the memory cells during programming of the memory cells by adjusting a programming parameter for memory cells being programmed to the first additional data state after performing programming without adjusting the programming parameter for memory cells being programmed to other data states having higher threshold voltages than the particular data state and lower threshold voltages than the first additional data state.

One embodiment includes a method of programming non-volatile storage comprising: applying programming pulses to a plurality of memory cells to program the memory cells into a set of data states, the programming pulses increase in magnitude by a step size; performing verification of programming of the memory cells; while performing verification for data state N of the set of data states, determining whether memory cells being programmed to data state N−1 of the set of data states are over programmed; and in response to determining that more than a threshold number of memory cells being programmed to data state N−1 are over programmed, reducing the step size for a subset of the programming pulses during the programming of the memory cells into the set of data states.

One embodiment includes a non-volatile storage apparatus comprising a plurality of memory cells and a control circuit connected to the memory cells. The control circuit is configured to perform a programming process that programs the memory cells into a set of data states by applying a set of programming pulses that increase in magnitude by a step size. The control circuit is configured to test for over programming during the programming process. The control circuit is configured to adjust the step size for the programming pulses during the programming process in response to determining during the programming process that at least a minimum amount of memory cells are over programmed.

One embodiment includes a non-volatile storage apparatus comprising a plurality of memory cells and a control circuit connected to the memory cells. The control circuit is configured to program the memory cells. The control circuit is configured to determine during programming of the memory cells whether a first group of the memory cells has more than a threshold number of over programmed memory cells. The control circuit is configured to adjust programming of a second group of the memory cells during the programming in response to determining that the first group of memory cells has more than the threshold number of over programmed memory cells.

In one embodiment, the first group of memory cells are being programmed to a first data state of a set of data states and the second group of memory cells are being programmed to one or more additional data states, other than the first data state, after programming completes for the first data state and prior to completion of the programming of the memory cells.

In one embodiment, each of the memory cells store multiple bits of data in multiple pages, reading a page of the multiple pages comprises testing threshold voltage of memory cells between a subset of data states, the first group of memory cells are programmed to a particular data state, the particular data state has an adjacent data state, reading a first page of the multiple pages comprises testing threshold voltage between the particular data state and the adjacent data state to the particular data state as well as testing between a first additional data state and a second additional data state, and the control circuit is configured to adjust programming of the second group of the memory cells during the programming by adjusting a programming parameter (e.g., verify target voltage) for the second group of memory cells being programmed to the first second additional data state after performing programming without adjusting the programming parameter for memory cells being programmed to other data states having higher threshold voltages than the particular data state and lower threshold voltages than the first second additional data state.

One embodiment includes a method of programming non-volatile storage comprising: applying programming to a plurality of memory cells to program the memory cells into a set of data states, each data state comprises a threshold voltage distribution such that data state N has higher threshold voltages than data state N−1 and lower threshold voltages than data state N+1, each data state corresponding to a respective verify target voltage of a set of verify target voltages; performing verification of programming of the memory cells by testing whether threshold voltages of memory cells being programmed have reached verify target voltages; while performing verification for data state N, determining whether memory cells being programmed to data state N−1 are over programmed; and in response to determining that more than a threshold number of memory cells being programmed to data state N−1 are over programmed and during the programming of the memory cells into the set of data states, increasing one or more verify target voltages for one or more data states having threshold voltages greater than state N.

One embodiment includes a non-volatile storage apparatus comprising a plurality of memory cells and a control circuit connected to the memory cells. The control circuit is configured to perform a programming process that programs the memory cells into a set of data states by applying programming and verifying the programming. The control circuit is configured to verify the programming by testing whether threshold voltages of memory cells have reached verify target voltages. The control circuit is configured to test for over programming during the programming process. The control circuit is configured to adjust the verify target voltages during the programming process in response to determining during the programming process that at least a minimum amount of memory cells are over programmed.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of memory cells; and
a control circuit connected to the memory cells, the control circuit is configured to program the memory cells into a set of data states by performing programming of the memory cells and verifying of the programming, the control circuit is configured to test for over programming of memory cells being programmed to a particular data state of the set of data states while verifying memory cells being programmed to a different data state than the particular data state, the control circuit is configured to adjust the programming of the memory cells during programming of the memory cells in response to determining that more than a minimum number of memory cells being programmed to the particular data state are over programmed;
each data state of the set of data states comprises a threshold voltage distribution such that data state N has higher threshold voltages than data state N−1 and lower threshold voltages than data state N+1;
the particular data state comprises a particular threshold voltage distribution;
an adjacent data state comprises a threshold voltage distribution that is adjacent to the particular threshold voltage distribution as compared to other threshold voltage distributions corresponding to the set of data states;
the control circuit is configured to test for over programming of memory cells being programmed to the particular data state of the set of data states while verifying memory cells being programmed to the adjacent data state.

2. The non-volatile storage apparatus of claim 1, wherein:
the control circuit is configured to adjust the programming of the memory cells during programming of the memory cells to reduce a number of programming errors in the memory cells being programmed to data states other than the particular data state.

3. The non-volatile storage apparatus of claim 1, wherein:
the control circuit is configured to perform programming by applying a set of programming pulses to the memory cells that increase in magnitude by a step size; and
the control circuit is configured to adjust programming of the memory cells during programming of the memory cells by changing the step size after starting to apply the set of programming pulses and prior to completing the set of programming pulses in order to narrow one or more data states other than the particular data state.

4. The non-volatile storage apparatus of claim 1, wherein:
the control circuit is configured to perform programming by applying a set of programming pulses to the memory cells that increase in magnitude by a step size; and
the control circuit is configured to adjust programming of the memory cells during programming of the memory cells by dynamically choosing a new step size based on an operating condition of the apparatus and using the new step size for the set of programming pulses prior to completing the set of programming pulses.

5. The non-volatile storage apparatus of claim 1, wherein:
the control circuit is configured to perform programming by applying a set of programming pulses to the memory cells that increase in magnitude by a step size; and
the control circuit is configured to adjust programming of the memory cells during programming of the memory cells by reducing the step size after starting to apply the set of programming pulses and prior to completing the set of programming pulses.

6. The non-volatile storage apparatus of claim 1, wherein:
the control circuit is configured to test for over programming of memory cells being programmed to the particular data state of the set of data states while verifying memory cells being programmed to the adjacent data state using a single sensing process.

7. The non-volatile storage apparatus of claim 1, wherein:
each of the memory cells store multiple bits of data in multiple pages;
reading a page of the multiple pages comprises testing threshold voltage between a subset of data states;
reading a first page of the multiple pages comprises testing threshold voltage between the particular data state and the adjacent data state as well as testing between a first additional data state and a second additional data state; and
the control circuit is configured to adjust programming of the memory cells during programming of the memory cells by adjusting a programming parameter for memory cells being programmed to the first additional data state after performing programming without adjusting the programming parameter for memory cells being programmed to another data state having higher threshold voltages than the particular data state and lower threshold voltages than the first additional data state.

8. The non-volatile storage apparatus of claim 7, wherein:
the control circuit is configured to perform programming by applying a set of programming pulses to the memory cells that increase in magnitude by a step size; and
the programming parameter is step size.

9. A non-volatile storage apparatus, comprising:
a plurality of memory cells; and
a control circuit connected to the memory cells, the control circuit is configured to program the memory cells into a set of data states by performing programming of the memory cells and verifying of the programming, the control circuit is configured to test for over programming of memory cells being programmed to a particular data state of the set of data states while verifying memory cells being programmed to a different data state than the particular data state, the control circuit is configured to adjust the programming of the memory cells during programming of the memory cells in response to determining that more than a minimum number of memory cells being programmed to the particular data state are over programmed;
each data state of the set of data states comprises a threshold voltage distribution;
each data state of the set of data states corresponding to a respective verify target voltage of a set of verify target voltages;
the control circuit is configured to adjust programming of the memory cells during programming of the memory cells by increasing one or more verify target voltages for one or more data states.

10. The non-volatile storage apparatus of claim 9, wherein:
the control circuit is configured to perform programming by applying a set of programming pulses to the memory cells that increase in magnitude by a step size; and
the control circuit is configured to adjust programming of the memory cells during programming of the memory cells by reducing the step size after starting to apply the set of programming pulses and prior to completing the set of programming pulses and by increasing one or more verify target voltages for one or more data states.

11. The non-volatile storage apparatus of claim 9, wherein:
the control circuit is configured to adjust programming of the memory cells during programming of the memory cells by dynamically choosing one or more verify target voltages for one or more data states based on an operating condition of the apparatus and using the new one or more verify target voltages to complete the programming.

12. A method of programming non-volatile storage, comprising:
applying programming pulses to a plurality of memory cells to program the memory cells into a set of data states, the programming pulses increase in magnitude by a step size;
performing verification of programming of the memory cells;
while performing verification for data state N of the set of data states, determining whether memory cells being programmed to data state N-1 of the set of data states are over programmed; and
in response to determining that more than a threshold number of memory cells being programmed to data state N-1 are over programmed, reducing the step size for a subset of the programming pulses during the programming of the memory cells into the set of data states.

13. The method of claim 12, wherein:
the reducing the step size for a subset of the programming pulses comprises reducing the step size for programming pulses for programming memory cells to only a subset of data states having higher threshold voltages than state N.

14. The method of claim 12, wherein:
each of the memory cells store multiple bits of data in multiple pages;
reading a page of the multiple pages comprises testing threshold voltage between a subset of data states;
reading a first page of the multiple pages comprises testing threshold voltage between data state N-1 and data state N as well as testing threshold voltage between a first additional data state and a second additional data state; and
the reducing the step size for a subset of the programming pulses comprises reducing the step size for programming pulses for programming memory cells to the first additional data state without reducing the step size for programming pulses for programming memory cells to another data state having threshold voltages higher than data state N.

15. A non-volatile storage apparatus, comprising:
a plurality of memory cells; and
a control circuit connected to the memory cells, the control circuit is configured to perform a programming process that programs the memory cells into a set of data states by applying a set of programming pulses that increase in magnitude by a step size, the control circuit is configured to test for over programming during the programming process, the control circuit is configured to adjust the step size for the programming pulses during the programming process in response to determining during the programming process that at least a minimum amount of memory cells are over programmed.

16. The non-volatile storage apparatus of claim 15, wherein:
the control circuit is configured to reduce the step size for the programming pulses during the programming process in response to determining during the programming process that at least a minimum amount of memory cells are over programmed in order to reduce over programming after reducing the step size.

17. The non-volatile storage apparatus of claim 15, wherein:
the control circuit is configured to dynamically adjust the step size for the programming pulses during the programming process based on an operating condition of the memory cells.

18. The non-volatile storage apparatus of claim 15, wherein:
the control circuit is configured to test for over programming during the programming process by testing whether memory cells being programmed to data state N-1 are over programmed during sensing of whether memory cells being programmed to data state N have been properly programmed.

19. The non-volatile storage apparatus of claim 15, wherein:
each of the memory cells store multiple bits of data in multiple pages; and the plurality of memory cells comprise a monolithic three dimensional array of NAND strings.

* * * * *